(12) United States Patent
Ono

(10) Patent No.: US 8,253,769 B2
(45) Date of Patent: Aug. 28, 2012

(54) SEMICONDUCTOR LASER DRIVE APPARATUS, OPTICAL WRITE APPARATUS, IMAGING APPARATUS, AND SEMICONDUCTOR LASER DRIVE METHOD

(75) Inventor: Kenichi Ono, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 865 days.

(21) Appl. No.: 11/854,169

(22) Filed: Sep. 12, 2007

(65) Prior Publication Data
US 2008/0002747 A1 Jan. 3, 2008

Related U.S. Application Data

(62) Division of application No. 10/757,390, filed on Jan. 15, 2004, now Pat. No. 7,292,612.

(30) Foreign Application Priority Data

Jan. 17, 2003 (JP) ................................. 2003-010205

(51) Int. Cl.
*B41J 2/435* (2006.01)
(52) U.S. Cl. ......... 347/246; 347/236; 347/237; 347/247
(58) Field of Classification Search .................. 347/246, 347/236, 261, 237, 247
See application file for complete search history.

(56) References Cited

U.S. PATENT DOCUMENTS

| | | | |
|---|---|---|---|
| 4,523,089 A | 6/1985 | Maeda et al. | |
| 4,928,277 A | 5/1990 | Monma et al. | |
| 5,309,269 A | 5/1994 | Shibao | |
| 5,365,258 A * | 11/1994 | Murata et al. | 347/232 |
| 5,784,091 A | 7/1998 | Ema et al. | |
| 5,946,334 A | 8/1999 | Ema et al. | |
| 6,137,522 A | 10/2000 | Melino et al. | |
| 6,195,371 B1 * | 2/2001 | Haneda et al. | 372/29.01 |
| 6,285,692 B1 | 9/2001 | Okayasu | |
| 6,370,175 B1 * | 4/2002 | Ikeda et al. | 372/38.1 |
| 6,396,858 B2 | 5/2002 | Kawakami et al. | |
| 6,549,265 B1 * | 4/2003 | Sakakibara et al. | 355/35 |

(Continued)

FOREIGN PATENT DOCUMENTS

JP 3-36777 2/1991

(Continued)

OTHER PUBLICATIONS

S. Hirata, CQ Publishing Co., Ltd. pp. 84-85 and 110-111, "Understanding Funamentals and Applications of Semiconductor Lasers", 2001.

*Primary Examiner* — Stephen Meier
*Assistant Examiner* — Sarah Al Hashimi
(74) *Attorney, Agent, or Firm* — Oblon, Spivak, McClelland, Maier & Neustadt, L.L.P.

(57) ABSTRACT

An optical write apparatus. The apparatus has a semiconductor laser drive apparatus that modulates a semiconductor laser according to a modulation signal and induces the semiconductor laser to emit light. The drive apparatus has a control unit that is adapted to supply a fixed bias current during a light emission off time, and start supplying a predetermined current that is less than a light emission threshold current right before a light emission time. The apparatus has a write unit that is adapted to realize optical writing on an image sustaining element by scanning a laser beam that is emitted from the semiconductor laser driven by the semiconductor laser drive apparatus using a polygon mirror.

15 Claims, 19 Drawing Sheets

U.S. PATENT DOCUMENTS

| | | |
|---|---|---|
| 6,917,639 B2 | 7/2005 | Ishida et al. |
| 7,170,536 B2 * | 1/2007 | Inagawa et al. ............... 347/133 |
| 2003/0035451 A1 | 2/2003 | Ishida et al. |

FOREIGN PATENT DOCUMENTS

| | | |
|---|---|---|
| JP | 6-204592 | 7/1994 |
| JP | 7-147446 | 6/1995 |
| JP | 11-112067 | 4/1999 |
| JP | 11-291548 | 10/1999 |
| JP | 2001-88344 | 4/2001 |
| JP | 2001-315381 | 11/2001 |
| JP | 2002-321402 | 11/2002 |

* cited by examiner

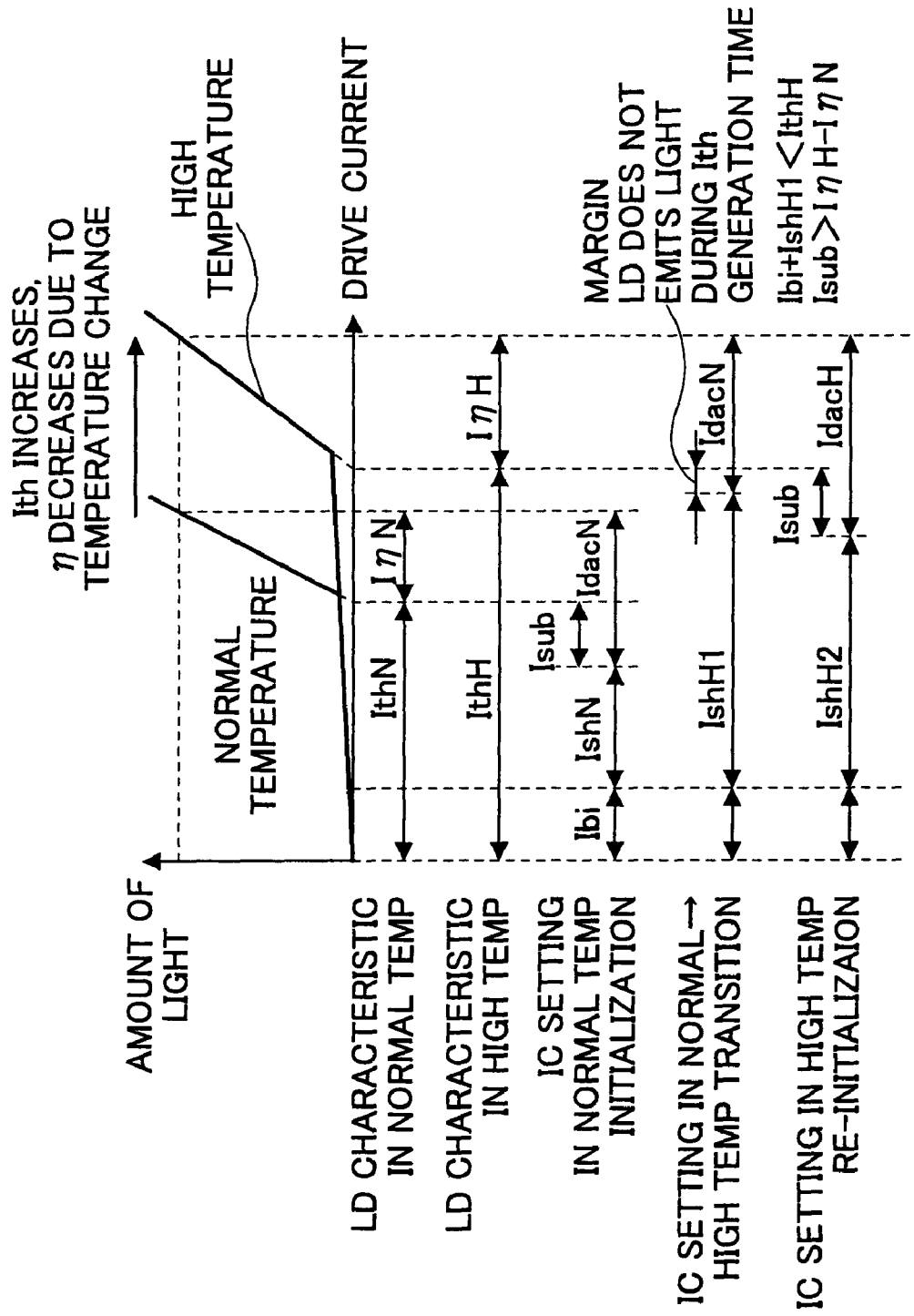

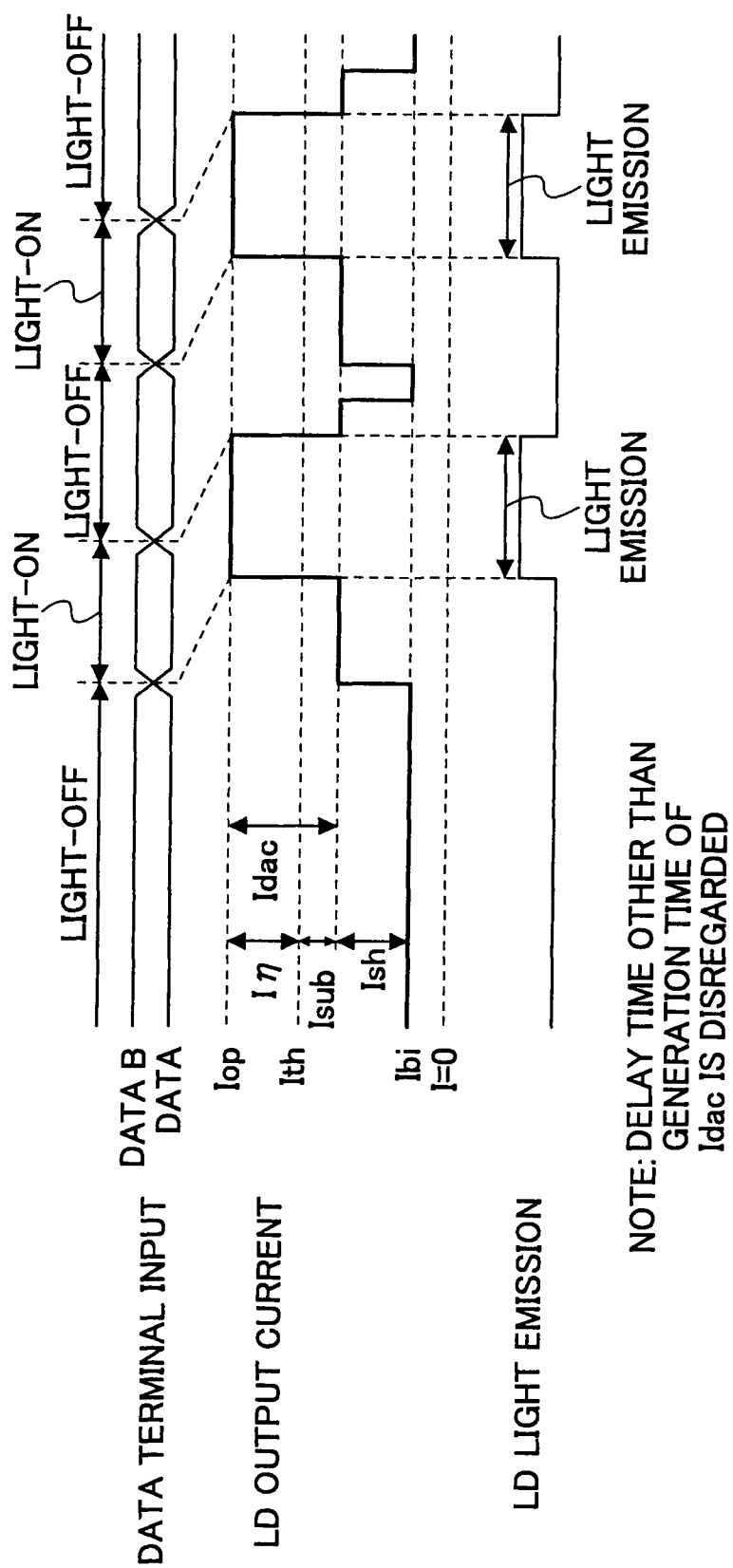

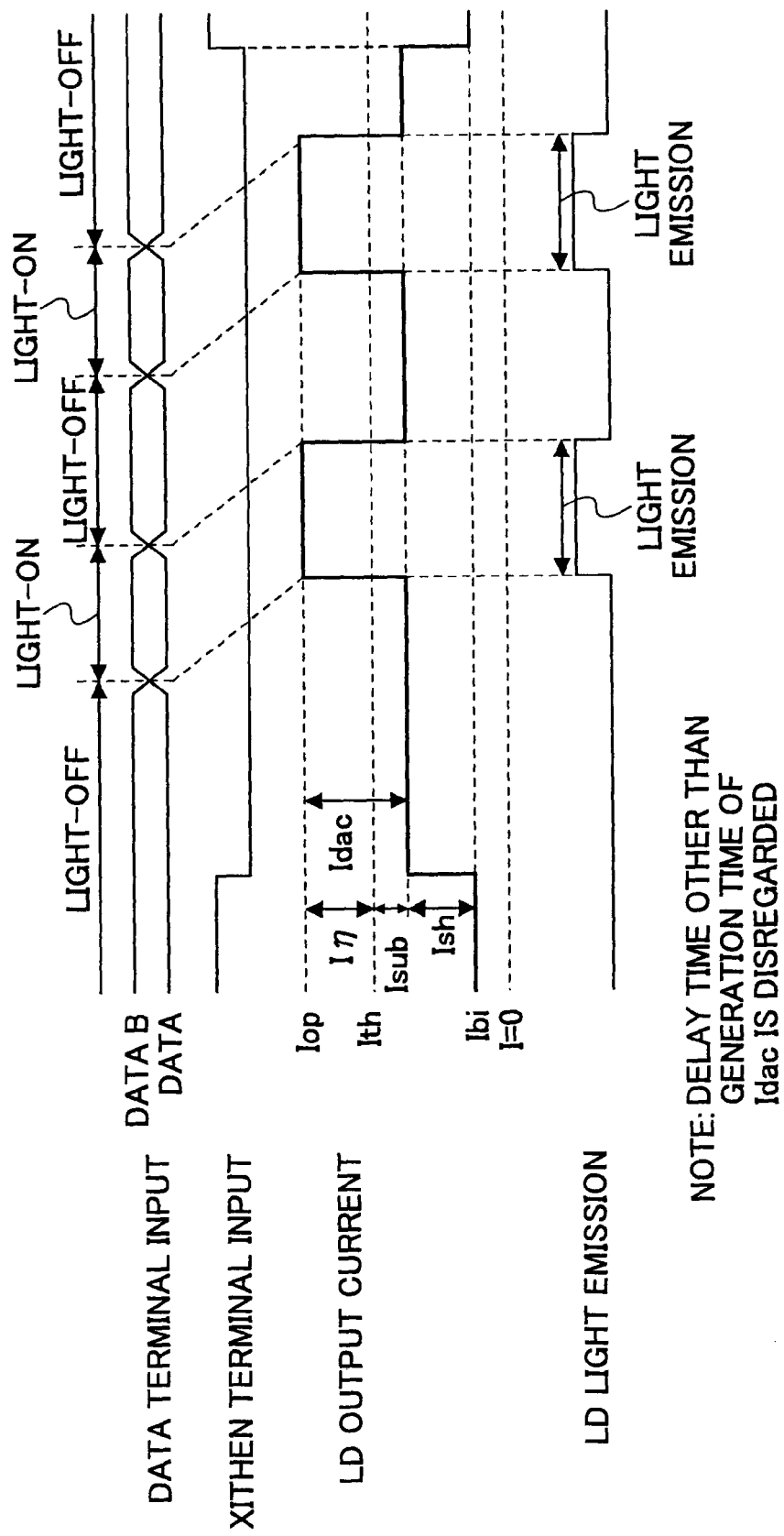

SEMICONDUCTOR LASER DRIVE APPARATUS, OPTICAL WRITE APPARATUS, IMAGING APPARATUS, AND SEMICONDUCTOR LASER DRIVE METHOD

CROSS REFERENCE TO RELATED APPLICATION

This application is a divisional of U.S. Ser. No. 10/757,390 which was filed Jan. 15, 2004 and claims priority to JP 2003-010205 filed Jan. 17, 2003, the entire contents of U.S. Ser. No. 10/757,390 are incorporated herein by reference.

BACKGROUND OF THE INVENTION

1. Field of the Invention

The present invention relates to a semiconductor laser drive apparatus using a modulation signal that drives a semiconductor laser to emit light, an optical write apparatus that implements such a semiconductor laser drive apparatus, an imaging apparatus such as a laser printer, a digital copying machine, and a facsimile machine, that implements such an optical write apparatus, and a semiconductor laser drive method using a modulation signal for driving a semiconductor laser to emit light.

2. Description of the Related Art

Technologies relating to the present invention are disclosed, for example, in Japanese Laid-Open Patent No. 2001-88344 and Japanese Laid-Open Patent No. 2002-32140.

Japanese Laid-Open Patent No. 2001-88344 discloses an imaging apparatus such as a digital copying machine that is adapted to form an image on a photoconductor drum by scanning the photoconductor drum with a laser beam output from a semiconductor laser oscillator so as to constantly obtain a stable optical output intensity regardless of a change in the environmental temperature and to thereby form an image with a stable density, in which apparatus light emission level stabilization control is performed on a light emission level of the semiconductor laser oscillator during a non-image formation time and a light emission level of the semiconductor laser oscillator during an image formation time so that both light emission levels may be maintained at their respective predetermined values.

Japanese Laid-Open Patent No. 2002-32140 discloses an imaging apparatus having a cheap and small structure that is adapted to modulate a semiconductor laser using a modulation signal to realize high speed modulation control of the semiconductor laser and acquire an optical quenching ratio, and form an electrostatic latent image on a photoconductor by scanning an optical beam from the semiconductor laser, the apparatus including a first current drive unit that supplies to the semiconductor laser a first current that does not actually cause the semiconductor laser to emit light but causes it to be in a state that allows high speed modulation, which first current is supplied at a first timing based on the modulation signal; and a second current drive unit that supplies to the semiconductor laser a second current that is turned on/off according to the modulation signal, which second current is supplied at a second timing that is later than the first timing based on the modulation signal; wherein the semiconductor laser is arranged to emit light by the combined current of the first current and second current.

In a semiconductor laser (LD), a threshold current (Ith) and an operation current (Iop) change depending on the temperature or the elapsed time, and thereby, a monitor photodiode (PD) that is implemented in the semiconductor laser monitors the amount of light being output and controls the current being supplied to the semiconductor laser so that the amount of light output may remain fixed. Accordingly, in a conventional optical write apparatus that performs on/off control of a semiconductor laser according to image data being input and scans a beam to write an image, a semiconductor laser drive circuit may use the following control methods:

① supplying the operation current (Iop) with which a predetermined amount of light can be obtained during light-on time, and not supplying the operation current during light-off time.

② reducing a turn on delay time by supplying a bias current (Ib) during light-off time in order to increase the switching speed.

③ setting a modulation current to a fixed value in order to reduce variations in the turn on delay, and changing the bias current in accordance with a change in the threshold current.

FIG. 1 is a graph illustrating a relation between an applied current in a semiconductor laser drive circuit that performs control according to the above control method ① and an amount of light. FIG. 2 is a circuit diagram showing a circuit configuration of this semiconductor laser drive circuit. According to this arrangement, the semiconductor laser drive circuit includes a semiconductor laser LD, a switch 1, a current source 2, a sample hold circuit 3, an amplifier 4, and a photodiode PD. The switch 1 is operated based on a modulation signal and performs on/off control of a modulation current applied to the semiconductor laser. The current source 2 supplies a drive current to the semiconductor laser LD according to a voltage set by the sample hold circuit 3. The photodiode PD feeds back a light emission quantity of the semiconductor laser LD as a feedback signal to the amplifier 4. According to a sampling signal from an external source, the sample hold circuit 3 samples an output from the difference amplifier 4 that receives the feedback signal from the photodiode PD and a light emission control voltage, and performs APC operations. Then, the APC-produced voltage is applied to the current source 2.

In such an arrangement, it is known that, owing to the required excitation time for the semiconductor laser LD, it takes time ns for the semiconductor laser LD to emit light from the time a current is supplied. This is referred to as turn on delay (refer to FIG. 3 and *Understanding Fundamentals and Applications of Semiconductor Lasers;* Hirata, Shoji; CQ Publishing Co., Ltd.; 2001). Also, the amplitude of the switching current is relatively large, and it is therefore difficult to increase the switching speed of the switch element (e.g., transistor). Thus, the laser emission rise time and fall time tend to be long.

FIGS. 4 and 5 respectively illustrate a current-light characteristic and a circuit configuration of a semiconductor laser drive apparatus that performs control according to the control method ②. In this method, during light-off time, a bias current with a fixed value is supplied. Thus, a bias current source 5 corresponding to a current source for the bias current is implemented parallel to the switch 1 and the current source 2 for the modulation current as is shown in FIG. 5. Other components of this semiconductor laser drive apparatus are identical to those shown in FIG. 2.

According to this method, the bias current needs to be arranged so that it does not exceed the threshold current Ith even when the threshold current (Ith) changes due to environmental temperature change and variations in the elements, and thus, the bias current cannot take a large value as is shown in FIG. 4. Therefore, the effects of supplying this bias current are not very adequate, and differences in the turn on delay time may occur since switching is performed without taking into consideration the potential differences in the actual threshold currents. Also, in FIG. 4, the threshold current Ith is represented by the intersecting point between the horizontal axis indicating no change in the amount of light and an extension of the line of the current-light characteristic curve at 25° C. with the greater inclination (slope) indicating a greater change rate of the amount of light with respect to the modulation current amount. This threshold current is arranged to be greater than the fixed bias current. The slope of the line intersecting the horizontal axis may also be referred to as the differential quantum efficiency, and this differential quantum efficiency is represented by $\eta$.

FIGS. 6 and 7 show a current-light characteristic and a circuit configuration of a semiconductor laser drive circuit that performs control according to the control method ③. According to this method, the bias current source 5 as is shown in FIG. 5 is arranged to supply a threshold current as the bias current (see FIG. 7). Other components of this semiconductor laser drive circuit are identical to those shown in FIG. 5. It is noted that this arrangement corresponds to the first prior art document described above (Japanese Laid-Open Patent No. 2001-88344). In this arrangement, the bias current is controlled to correspond to the threshold current so that turn on delay can be minimized and optimal light emission can be realized.

However, since the threshold current is constantly being supplied according to this arrangement, light may inherently be emitted even when light emission is unnecessary (i.e., during light-off period). Although the inherent light emission may not amount to much, the light is still irradiated onto the photoconductor which may lead to fogging and degradation of the photoconductor drum. Also, as can be appreciated from FIGS. 1, 4, and 6, the differential quantum efficiency (slope) tends to decrease with the increase in temperature; thus, when the modulation current detected at a low temperature is used as the fixed modulation current, at high temperature, the bias current may exceed the actual threshold current thereby increasing the offset light emission.

SUMMARY OF THE INVENTION

The present invention has been conceived in response to the problems of the related art, and its object is to provide a semiconductor laser drive apparatus and a semiconductor laser drive method for obtaining an optimal laser emission pulse that is able to reduce inherent light emission as well as turn on delay so that the semiconductor laser can emit light without delay and fogging and degradation of the photoconductor can be prevented.

Another object of the present invention is to provide an optical write apparatus that implements a semiconductor laser drive apparatus and an imaging apparatus that implements such an optical write apparatus, the semiconductor laser drive apparatus being adapted to obtain an optimal laser emission pulse that is able to reduce inherent light emission as well as turn on delay so that the semiconductor laser can emit light without delay and fogging and degradation of the photoconductor can be prevented.

Specifically, a semiconductor laser drive apparatus according to an embodiment of the present invention modulates a semiconductor laser according to a modulation signal and induces the semiconductor laser to emit light, the apparatus including:

a control unit that is adapted to supply a fixed bias current during a light emission off time, and start supplying a predetermined current that is less than a light emission threshold current right before a light emission time.

A semiconductor laser drive apparatus according to another embodiment of the present invention modulates a semiconductor laser according to a modulation signal and induces the semiconductor laser to emit light, the apparatus including:

a control unit that is adapted to refrain from supplying a current during a light emission off time, and start supplying a predetermined current that is less than a light emission threshold current right before a light emission time.

A semiconductor laser drive apparatus according to another embodiment of the present invention modulates a semiconductor laser according to a modulation signal and induces the semiconductor laser to emit light, the apparatus including:

a control unit that is adapted to supply a predetermined current that is less than a light emission threshold current when a light emission command signal is received, and supply a modulation current after a predetermined time period passes from the time the predetermined current is supplied.

Further, in the semiconductor laser drive apparatus of the present invention, the predetermined current may correspond to a current that is close to the light emission threshold current.

In another embodiment, the predetermined current may correspond to a sum of the bias current and a current obtained from sampling a light emission state of the semiconductor laser.

In another embodiment, the control unit may be adapted to determine a differential quantum efficiency at least in one of a case where power is turned on and a case where a job is to be started.

In another embodiment, the control unit may be adapted to determine a differential quantum efficiency at predetermined time intervals.

In a further embodiment, the control unit may be adapted to determine the differential quantum efficiency based on a current for obtaining a predetermined amount of light, and a current for obtaining a prescribed portion of the predetermined amount of light.

In another embodiment, the control unit may include a function for setting a difference between the light emission threshold current and the predetermined current that is less than the light emission threshold current and is supplied right before the light emission time.

In a further embodiment, the difference may be set by means of an external terminal.

In another embodiment, the difference may be set to a value that is greater than or equal to a difference between a light emission current at a time of initialization and a light emission current at a time when the environmental temperature is increased from the time of initialization.

In another embodiment, a supply time for supplying the predetermined current that is less than the light emission threshold current may be arbitrarily set.

In another embodiment, a signal indicating a supply time for supplying the predetermined current that is less than the light emission threshold current may be input, which signal is independent from a signal indicating a drive time for driving the semiconductor laser to emit a predetermined amount of light.

In another embodiment, the control unit may include:

a modulation current source that is adapted to supply a modulation current to the semiconductor laser based on a switching operation realized by a modulation signal;

a bias current source that is implemented parallel to the modulation current source and is adapted to supply the bias current having a fixed value; and a control current source that is implemented parallel to the modulation current source and is adapted to supply a control current that is set by a sample hold circuit based on a switching operation realized by a threshold ON signal.

An optical write apparatus according to the present invention includes a semiconductor laser drive apparatus of the present invention, and a write unit for realizing optical writing on an image sustaining element by scanning a laser beam emitted from a semiconductor laser that is driven by the semiconductor drive apparatus using a polygon mirror.

In a further embodiment, the optical write apparatus of the present invention may include a temperature detection unit for detecting the temperature of the semiconductor laser or a location in the vicinity of the semiconductor laser, and an initialization unit for performing initialization of the semiconductor laser drive apparatus based on the temperature detected by the temperature detection unit.

An imaging apparatus of the present invention includes:
an optical write apparatus of the present invention;
an image developing unit that is adapted to develop an image written on the image sustaining element by means of the optical writing apparatus; and
a recording unit that is adapted to record the image developed by the image developing unit on a recording medium.

In a further embodiment, the imaging apparatus of the present invention may include an input apparatus that is adapted to input image information based on which an image is recorded on the recording medium.

A semiconductor laser drive method of the present invention for modulating a semiconductor laser based on a modulation signal and inducing the semiconductor laser to emit light includes:
supplying a fixed bias current during a light emission off time; and
starting to supply a predetermined current that is less than a light emission threshold current right before a light emission time.

A semiconductor laser drive method according to another embodiment of the present invention for modulating a semiconductor laser based on a modulation signal and inducing the semiconductor laser to emit light includes:
refraining from supplying a current during a light emission off time; and
starting to supply a predetermined current that is less than a light emission threshold current right before a light emission time.

A semiconductor laser drive method according to another embodiment of the present invention for modulating a semiconductor laser based on a modulation signal and inducing the semiconductor laser to emit light includes:
starting to supply a predetermined current that is less than a light emission threshold current when a light emission command signal is received; and
starting to supply a modulation current after a predetermined time period passes from the time the predetermined current starts being supplied.

In a further embodiment, the semiconductor laser drive method of the present invention may include setting a supply time for supplying the predetermined current that is less than the light emission threshold current to an arbitrary time.

In another embodiment, the semiconductor laser drive method of the present invention may include inputting a signal indicating a supply time for supplying the predetermined current that is less than the light emission threshold current, which signal is independent from a signal indicating a drive time for driving the semiconductor laser to emit a predetermined amount of light.

According to the semiconductor laser drive apparatus and method of the present invention, a current is not supplied or a fixed bias current is supplied during a light emission off time, and a predetermined current that is close to but less than a light emission threshold current starts being supplied right before a light emission time so that inherent light emission may be prevented when light emission is undesired. In other words, the predetermined current starts being supplied when a light emission command signal is received, and a modulation current for inducing the light emission of the semiconductor laser starts being supplied after a predetermined time period passes from the time the predetermined current starts being supplied. In this way, the light emission time is delayed from the light emission signal supply time by the predetermined time period during which time period the predetermined current is supplied so that the semiconductor laser may be modulated without turn on delay. Thus, a laser emission pulse that can reduce inherent light emission as well as turn on delay can be obtained.

Further, since the light emission threshold current may be determined when the power is tuned on or when a job is to be started, undesired or unnecessary light emission for the determination of a differential quantum efficiency may be minimized, and for example, when this embodiment is applied to an imaging apparatus, unnecessary or undesired toner image may be prevented from being formed on the photoconductor and the degradation of the photoconductor may be prevented.

Also, since the differential quantum efficiency may be determined at predetermined intervals, and the predetermined current that is less than the light emission threshold current may be controlled based on the determined differential quantum efficiency, inherent light emission can be prevented from being unnecessarily large even without implementing a temperature detection unit.

Also, since the differential quantum efficiency may be obtained based on a current for obtaining a predetermined amount of light and a current for obtaining a portion of the predetermined amount of light, the operation of determining the light emission threshold current may be realized in a practical manner.

Also, by allowing the difference between the light emission threshold current and the predetermined current that is less than the light emission threshold current to be set arbitrarily, inherent light emission due to the predetermined current that is less than the light emission threshold current may be reduced, and inherent light emission can be prevented from being unnecessarily large even when a change occurs in the difference between the threshold current and the drive current due to a change in the differential quantum efficiency, which changes according to environmental temperature change.

Further, since the difference may be arbitrarily set by an external terminal, this difference may be set according to the characteristics of the semiconductor laser.

Also, when the difference is set to a value that is greater than or equal to a difference between a current at an initialization time and a current at a higher temperature, for example, to several mA, both the turn on delay at a light emission time and inherent light emission due to the predetermined current may be prevented.

Also, when a supply time for supplying the predetermined current may be arbitrarily set, both the turn on delay at a light emission time and inherent light emission due to the predetermined current may be prevented.

When a signal indicating a supply time for supplying the predetermined current is input independently from the signal indicating the drive time of the semiconductor laser, the predetermined current may be supplied without other restrictions, and both the turn on delay at a light emission time and inherent light emission due to the predetermined current may be prevented. Also, even when the semiconductor laser drive apparatus is realized by an analog device so that implementing a large-scale logic circuit would be costly, by implementing such logic circuit in a digital IC preceding the analog device, an inexpensive semiconductor laser drive apparatus may be realized.

Also, by supplying a control current that is set by a sample hold circuit based on a switching operation realized by a threshold ON signal, inherent light emission time due to the predetermined current may be reduced.

Also, by supplying a temperature detection unit and an initialization unit, the temperature of the semiconductor laser (environmental temperature) may be monitored, and the differential quantum efficiency may be determined according to temperature increase to control the predetermined current, so that the amount of inherent light emission may be prevented from becoming unnecessarily large even when temperature change occurs within the apparatus.

It is noted that in the following descriptions of the preferred embodiments of the present invention, Ibi corresponds to the bias current, ASIC 30 represents the control unit as a whole, Ith corresponds to the light emission threshold current, Ibi+ Ish corresponds to the predetermined current that is equivalent to the sum of the bias current and the current obtained by sampling a light emission state of the semiconductor laser, Isub corresponds to the function for setting the difference between the predetermined current and the light emission threshold current, Isub setting terminal corresponds to the external terminal, the threshold ON signal corresponds to setting the supply time of the predetermined current and inputting a signal indicating the supply time for supplying the predetermined current (setting is performed at a preceding IC), the current source 2 corresponds to the modulation current source, the current source 5 corresponds to the bias current source, the current source 6 corresponds to the control current source, the temperature sensor 15 corresponds to the temperature detection unit, and the LD driver 30 corresponds to the initialization unit.

BRIEF DESCRIPTION OF THE DRAWINGS

FIG. 20 is a diagram showing a characteristic in a case where a DAC current corresponding to a sum of the determined light emission current and an arbitrary current is used in order to prevent the semiconductor laser from emitting light during the Ith generation period when the temperature increases after the initialization;

FIG. 21 is a timing chart showing the output timings of signals to realize the characteristic of FIG. 20; and FIG. 22 is another timing chart showing the output timings of signals in a case where the timing of the Ith generation period may be arbitrarily controlled by an external terminal.

DESCRIPTION OF THE PREFERRED EMBODIMENTS

In the following, preferred embodiments of the present invention are described with reference to the accompanying drawings.

Figure 8:
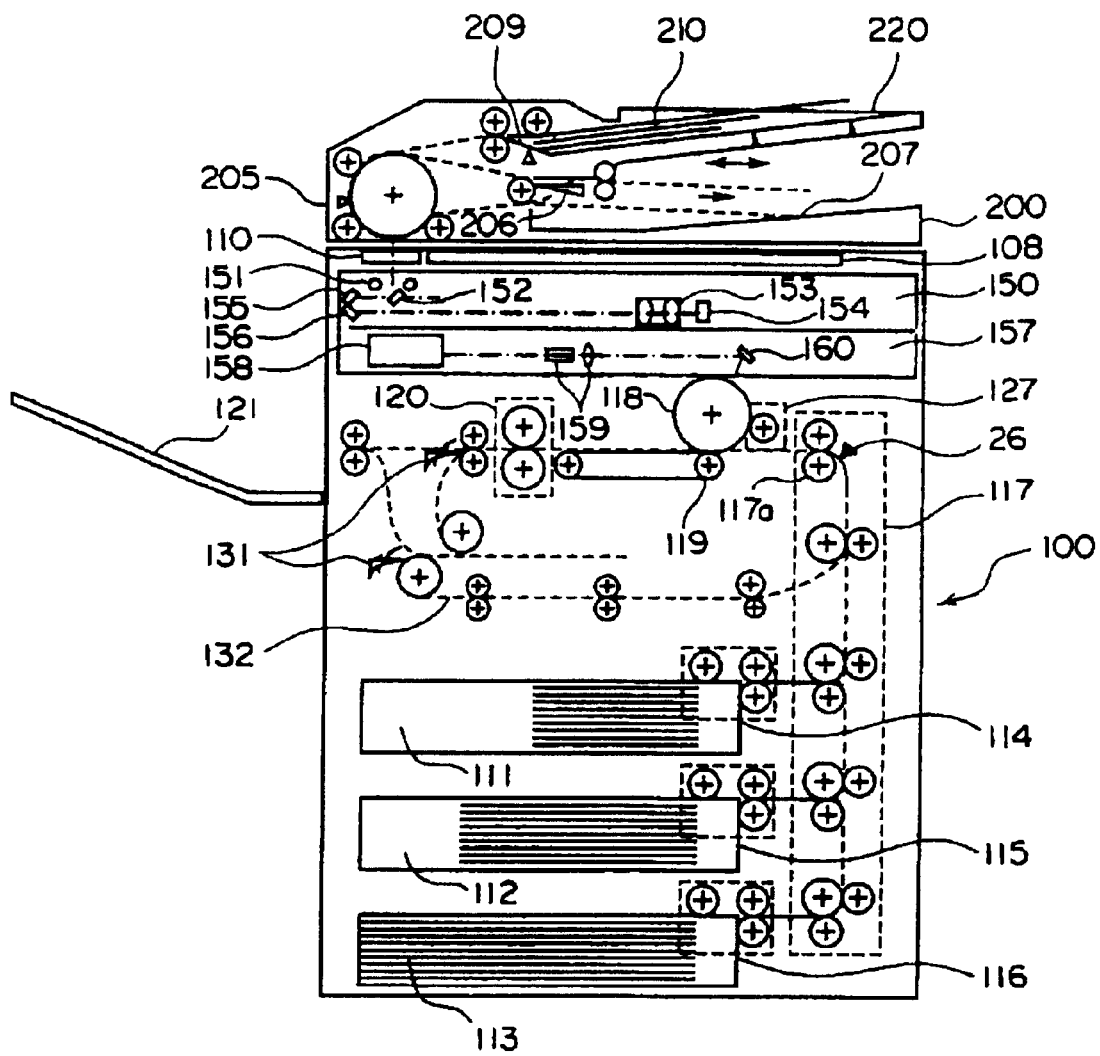
FIG. 8 is a schematic diagram showing a mechanical configuration of an imaging apparatus according to an embodiment of the present invention.
Figure 9:
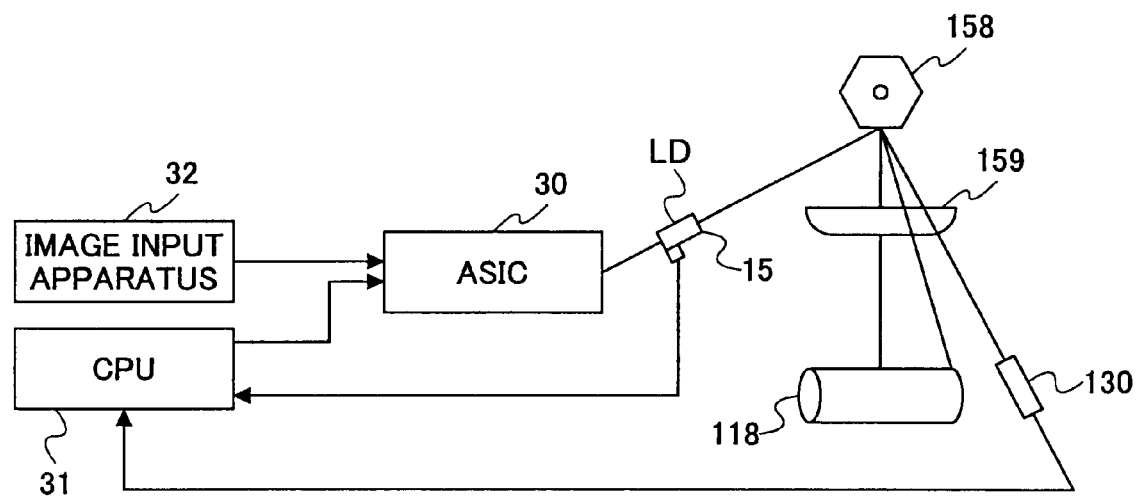
FIG. 9 is a block diagram showing a configuration of a write unit according to an embodiment of the present invention.

FIG. 8 is a schematic diagram illustrating a mechanical configuration of an imaging apparatus according to an embodiment of the present invention. FIG. 9 is a diagram illustrating a configuration of a write unit. The imaging apparatus shown in FIG. 8 is roughly made up of an automatic document feeder (ADF) 200 and an imaging apparatus main body 100. In the ADF 200, a stack of documents 210 may be placed on a document holder 220 with the image side up. A document detection sensor 209 may detect the documents 210 set in the document holder 220, and when a start (print) key of an operation unit (not shown) is pressed, the document sheets 210 may be fed to the apparatus starting with the document sheet at the top of the stack. When the front edge of a document sheet reaches the position where a resist sensor 205 is set, the paper feeding operation temporarily halts. Then, the operation restarts and the document that has reached the resist sensor 205 is read by a read unit 150 at an ADF document read position 110 of the imaging apparatus main body 100. In the case where only one side of the document is read, the document is discharged to a document discharge tray 207. In the case where both sides of the document are read, the document is flipped at the document discharge tray 207 and re-fed to the apparatus through a document separator 206 so that the other side of the document is read. Also, documents such as pages of a book are placed on a contact glass 108 so that the read unit 150 may read the document.

The imaging apparatus 100 has a first paper feed tray 111, a second paper feed tray 112, and a third paper feed tray 113, respectively implementing a first paper feed apparatus 114, a second paper feed apparatus 115, and a third paper feed apparatus 116. Sheets of transfer paper are stocked in each of the paper feed trays, and a transfer paper sheet stocked in any one of the paper feed trays may be fed to the apparatus through its corresponding paper feed apparatus. The sheet is carried by a common vertical carrier unit 117 through a conveyance route 26 to a resist roller 117*a*, and is further carried from the resist roller 117*a* toward a photoconductor 118 so as to be in contact with the photoconductor 118. The image data read by the read unit 150 are written on the photoconductor 118 by a laser beam from a write unit 157, and a toner image is formed on the photoconductor 118 by a developing unit 127. The transfer paper sheet is carried by a conveyor belt 119 at a speed matching the rotational speed of the photoconductor 118 so that the toner image formed on the photoconductor 118 is transferred onto the transfer paper sheet. Then, the image transferred onto the transfer paper sheet is fixed at a fixing unit 120, after which the transfer paper is discharged to a discharge tray 121.

In the case of forming an image on both sides of the transfer paper sheet, instead of the sheet being guided toward the discharge tray 121 from the fixing unit 120, the sheet is carried to a duplex side conveyor path 132 by separators 131 used for changing paths. Then, the sheet carried by the duplex side conveyor path 132 is re-fed to the vertical carrier unit 117 so that a toner image formed on the photoconductor 118 can be transferred onto the other side of the transfer paper sheet. After the second toner image transfer operation, the transferred image is fixed at the fixing unit 120 and the transfer paper sheet is guided toward the discharge tray 121.

The read unit 150 is made up of the contact glass 108 on which a document can be placed and an optical scanning system. The optical scanning system may include an exposure lamp 151, a first mirror 152, a second mirror 155, a third mirror 156, a lens 153, and a CCD image sensor 154, for example. The exposure lamp 151 and the first mirror 152 may be fixed on a first carriage (not shown) and the second mirror 155 and the third mirror 156 may be fixed on a second carriage (not shown).

In reading a document image from the contact glass 108, the first carriage and the second carriage may be mechanically moved at relative speeds of 2 to 1. This optical scanning system may be driven by a scanner drive motor (not shown). On the other hand, in reading a document image of a document that is supplied from the ADF 200, the exposure lamp 151 and the first mirror 152 mounted on the first carriage, and the second mirror 155 and the third mirror 156 mounted on the second carriage are fixed to their positions as shown in FIG. 8. The document image is read by a CCD image sensor 154, and the read image data are converted into an electrical signal to be processed.

The write unit 157 is made up of a laser output unit including a polygon mirror 158, an imaging lens 159, and a mirror 160. The laser output unit implements a semiconductor laser (LD) corresponding to a laser beam source and the polygon mirror 158 that rotates at a fixed high rotational speed by means of a motor. A laser beam that is emitted from the semiconductor laser LD is deflected at the polygon mirror 158, after which it passes through the imaging lens 159 to be reflected at the mirror 160 so that a latent image is condensed onto the surface of the photoconductor 118. The deflected laser beam is scanned in a main scanning direction that is perpendicular to the rotating direction of the photoconductor 118, and realizes recording in line units of an image signal output from an output data selector of an image processing unit (not shown). By repeating the main scanning operation in predetermined cycles according to the rotational speed of the photoconductor 118 and the recording density, an image (electrostatic latent image) may be formed on the surface of the photoconductor 118.

The laser beam output from the write unit 157 is irradiated onto the photoconductor 118 of an image forming system. As is shown in FIG. 9, a beam sensor 130 that generates a main scanning synchronization signal is implemented close to one end of the photoconductor 118 at a position where the laser beam is irradiated. Based on the main scanning synchronization signal, a start timing of image recording in the main scanning direction is controlled, and a control signal for inputting and outputting an image signal is generated. It is noted that FIG. 9 also shows an ASIC 30, a CPU 31, and an image input apparatus 32, which are described below.

Figure 10:
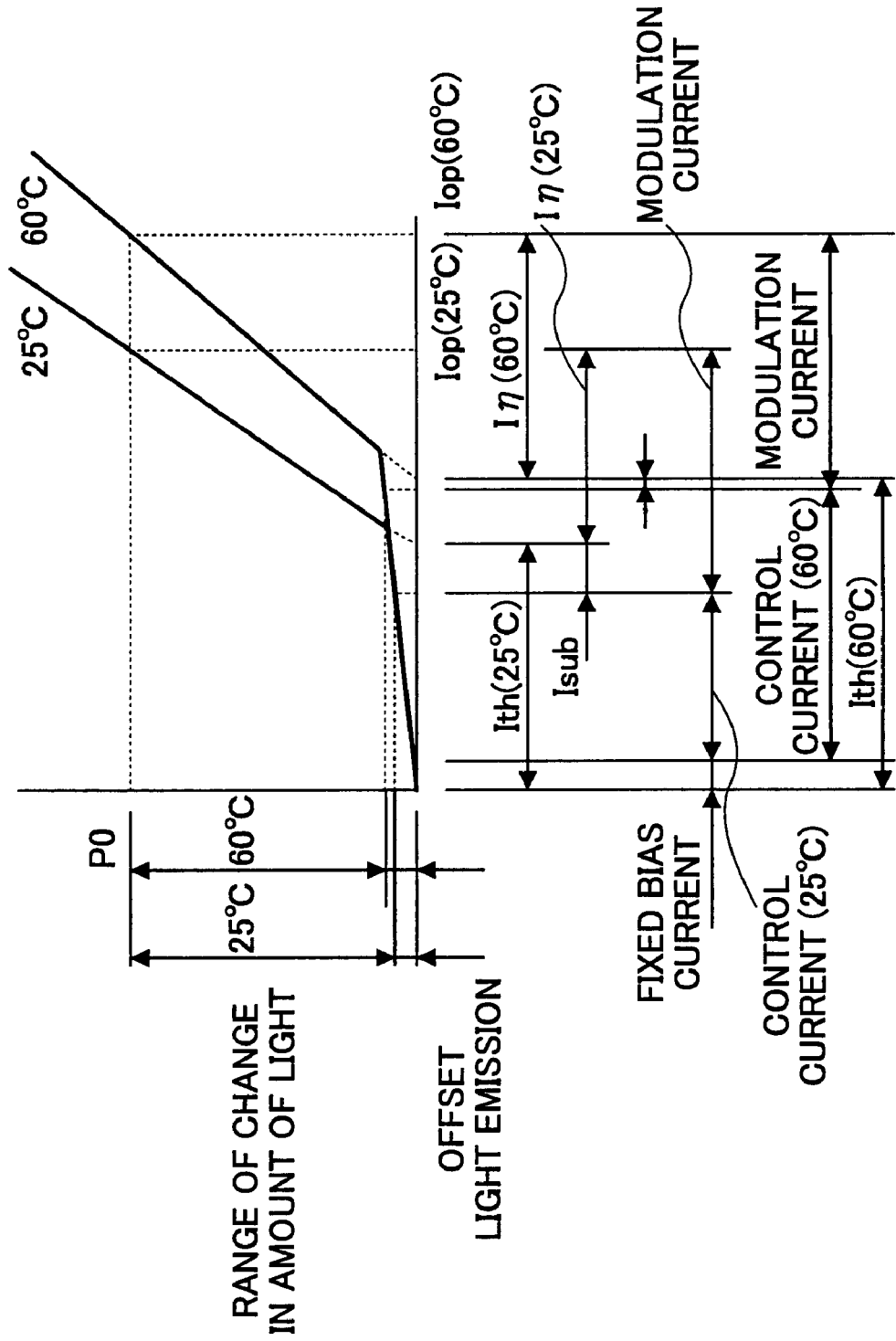
FIG. 10 is a graph showing a current-light emission characteristic (IL curve) of a semiconductor laser according to an embodiment of the present invention.
Figure 11:
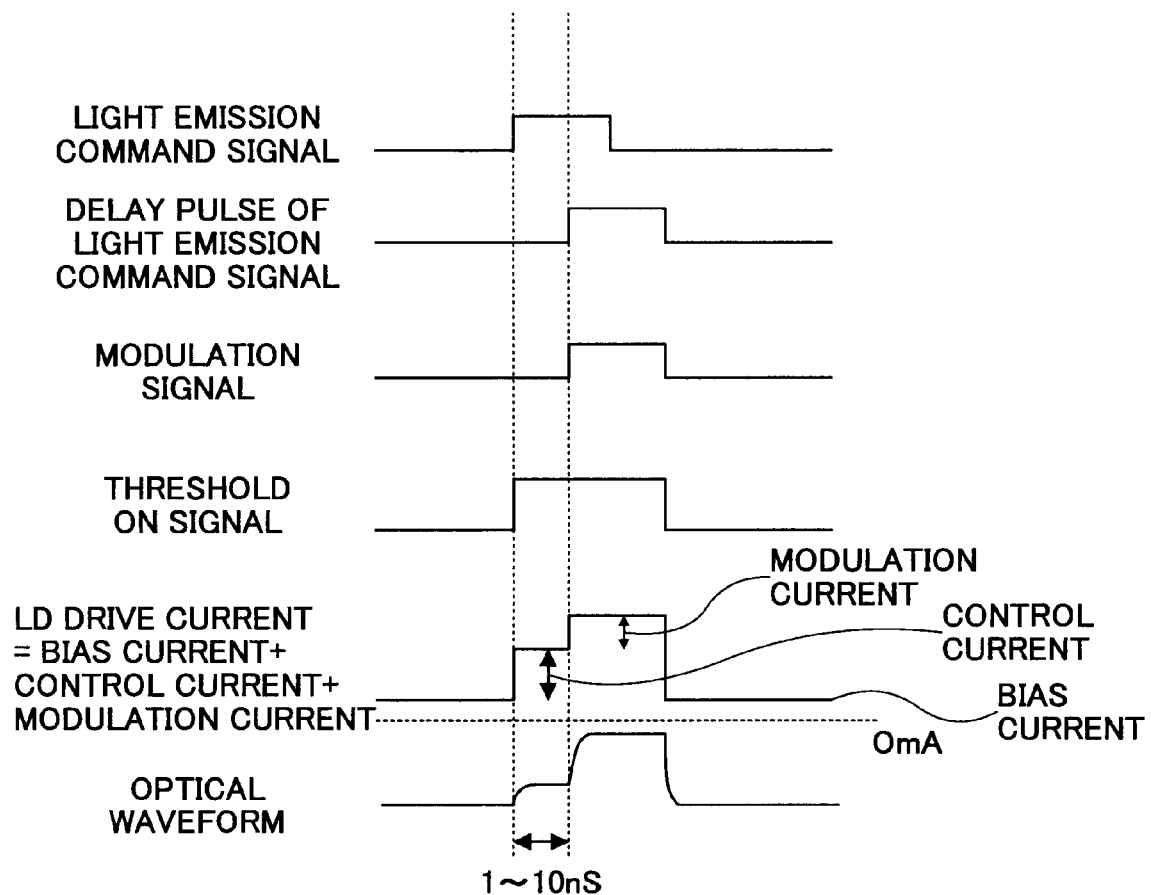
FIG. 11 is a timing diagram showing waveforms of signals used in a circuit configuration of FIG. 12 to realize the characteristic of FIG. 10.
Figure 12:
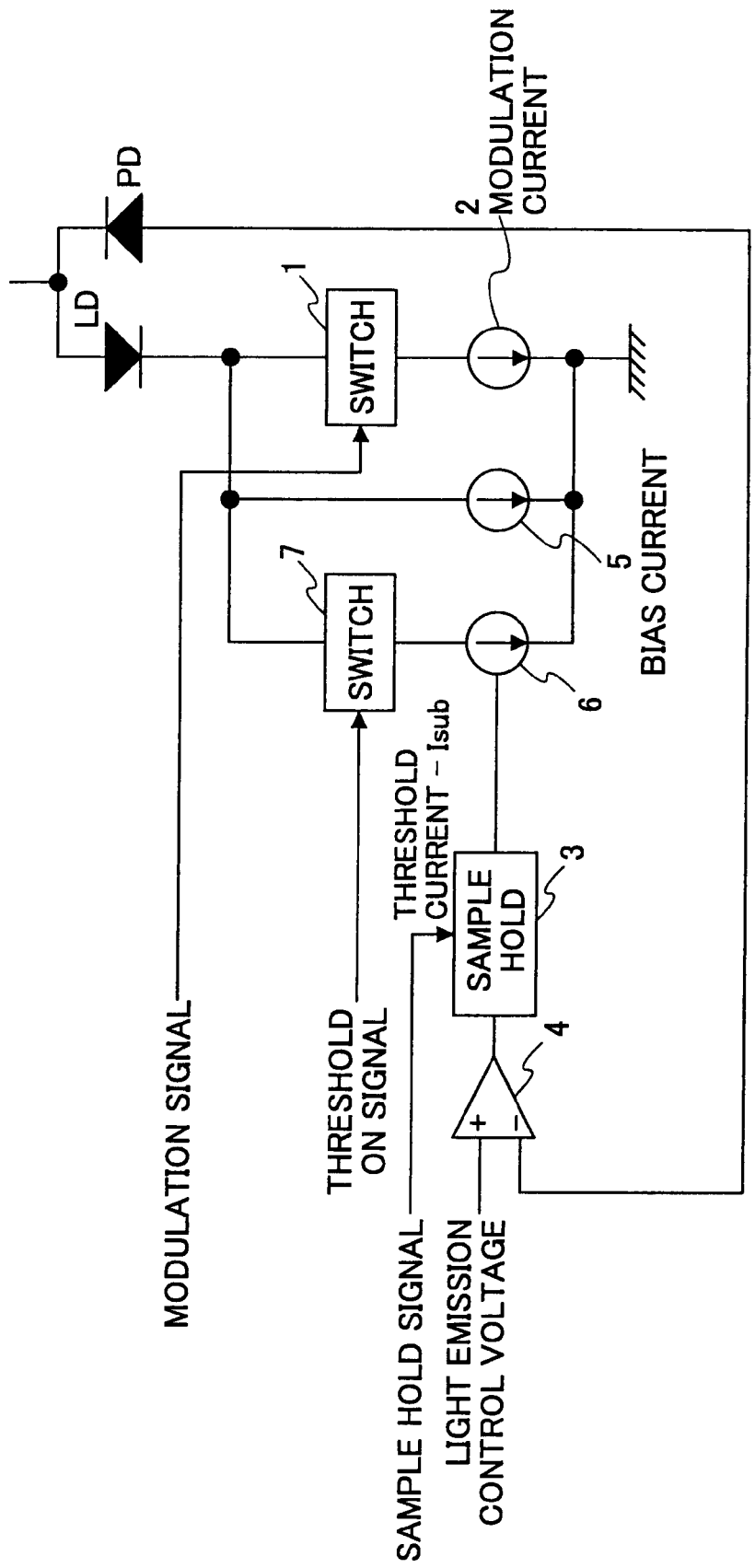
FIG. 12 is a block diagram showing a circuit configuration of a semiconductor laser drive apparatus according to an embodiment of the present invention.

In the following, an operation according to an embodiment of the present invention is described by referring to FIG. 10 showing a current-light quantity characteristic (IL curve) of a semiconductor laser LD according to the present embodiment, FIG. 11 showing waveforms of various signals used in the present embodiment, and FIG. 12 showing a circuit configuration of a semiconductor laser drive apparatus according to the present embodiment.

Figure 1:
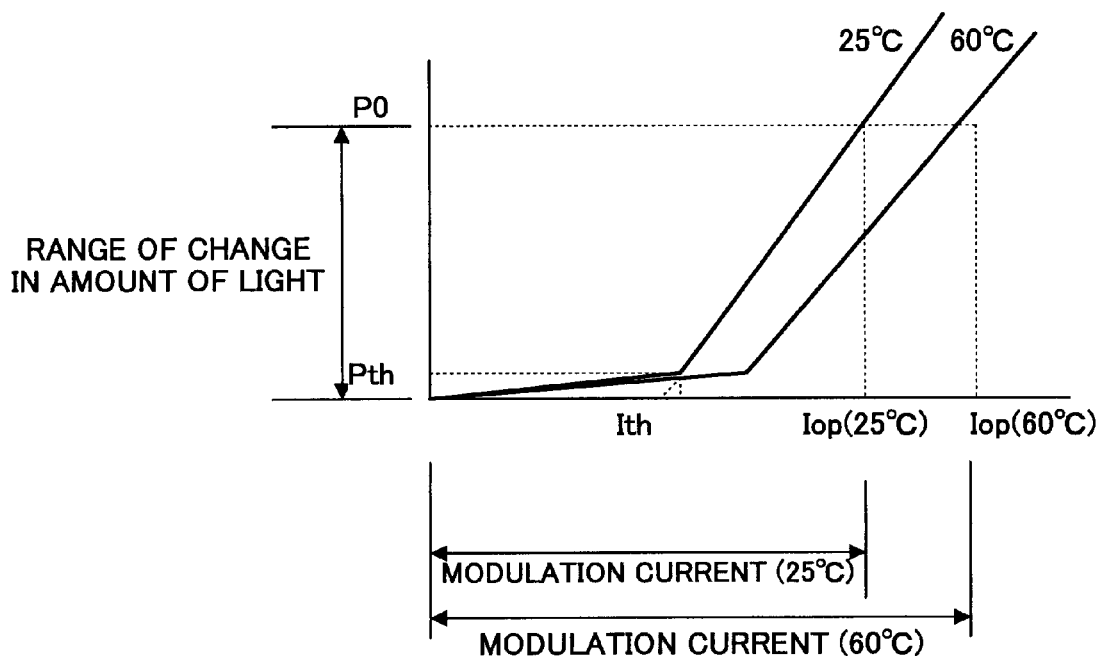
FIG. 1 is a graph showing a characteristic relation between an applied current and an amount of light emission in an application of a semiconductor laser drive circuit that controls a semiconductor laser by supplying a current for obtaining a predetermined amount of light during a light-on period, and supplying no current during a light-off period according to the related art.
Figure 2:
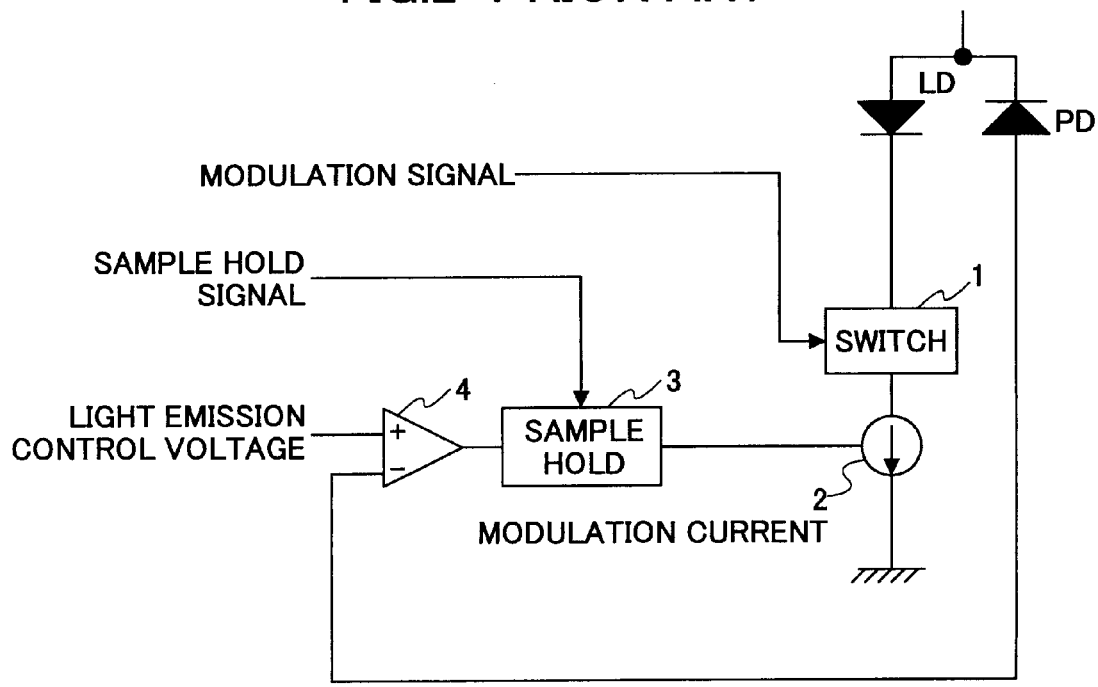
FIG. 2 is a block diagram showing a circuit configuration of the semiconductor laser drive circuit of the related art that realizes the characteristic shown in FIG. 1.
Figure 3:
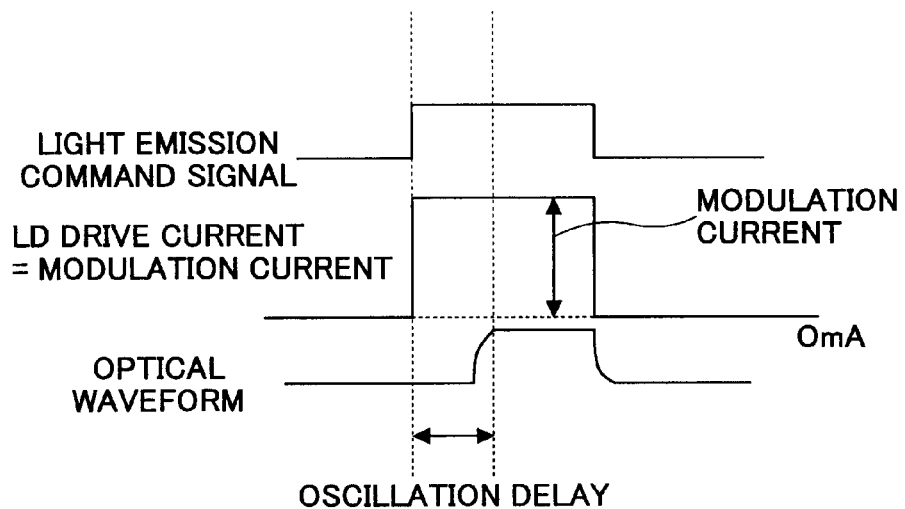
FIG. 3 is a timing diagram showing waveforms representing a turn on delay according to the characteristic of FIG. 1.
Figure 4:
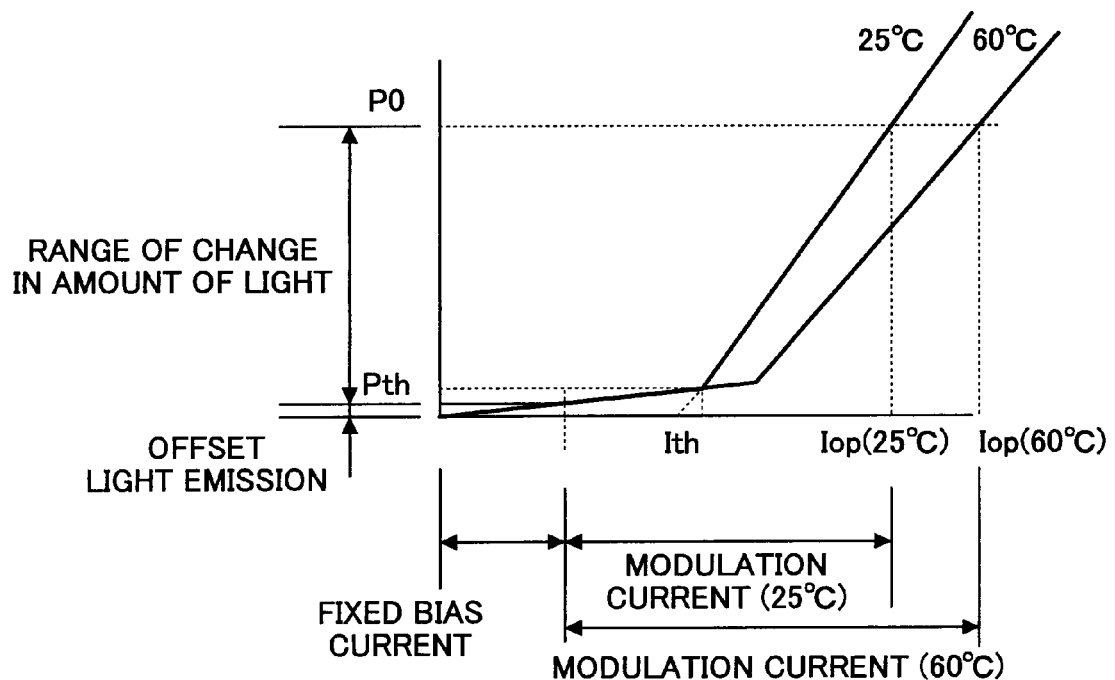
FIG. 4 is a graph showing a characteristic in an application of a conventional semiconductor laser drive circuit that performs control by supplying a bias current that has a fixed value during the light-off period to counter the turn on delay.
Figure 5:
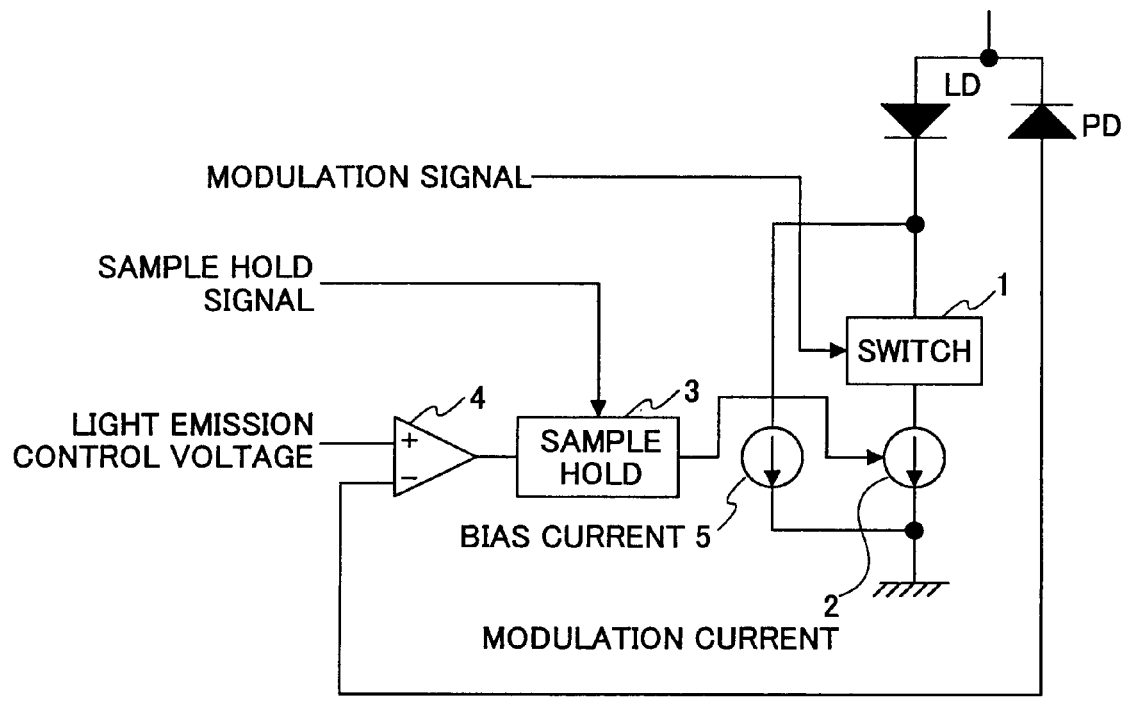
FIG. 5 is a block diagram showing a circuit configuration of the semiconductor laser drive circuit of the related art that realizes the characteristic shown in FIG. 4.
Figure 6:
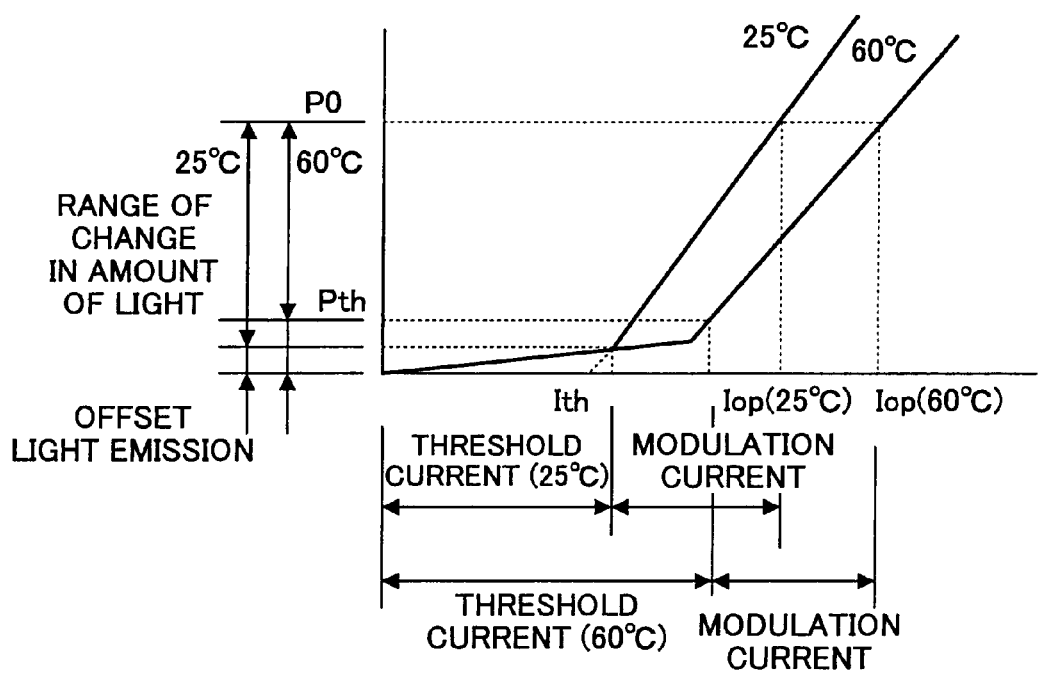
FIG. 6 is a graph showing a characteristic in an application of a semiconductor laser drive circuit that performs control by maintaining a modulation current at a fixed value in order to reduce differences in the turn on delay, and supplying a bias current that changes according to a change in a threshold current according to the related art.
Figure 7:
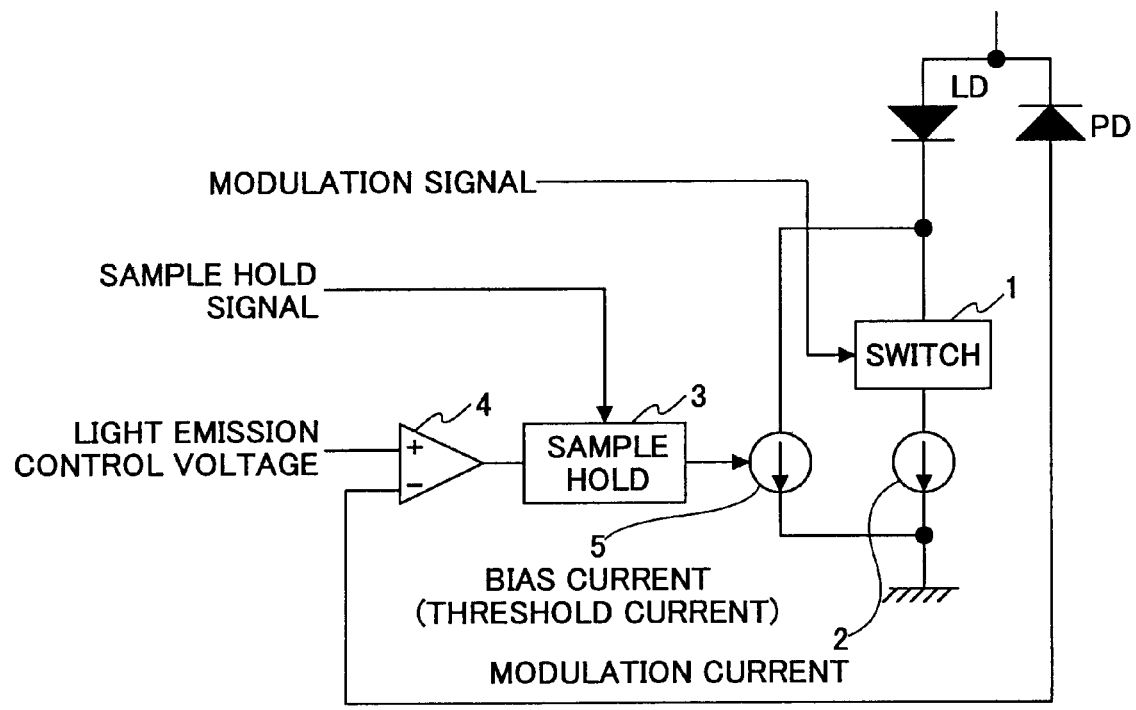
FIG. 7 is a block diagram showing a circuit configuration of the semiconductor laser drive circuit of the related art that realizes the characteristic shown in FIG. 6.

As is shown in the circuit diagram of FIG. 12, according to the present embodiment, a switch 7 and a current source 6 supplying a current indicated as (threshold current-Isub) are serially connected, and the serially connected switch 7 and current source 6 are implemented parallel to the bias current source 5 shown in FIG. 5. Other components of the circuit configuration of FIG. 12 are identical to those of FIG. 5. The current being supplied to the bias current source 5 has a fixed value, and the light emission of the semiconductor laser LD (offset light emission) by this current needs to be arranged so that fogging and degradation of the photoconductor 118 are not caused. For example, if the current is set to be in the order of 1 mA, the offset light emission will hardly occur but the switching speed can be increased since a forward voltage is being applied to the semiconductor laser. If such an effect is not desired, the current does not have to be supplied, and refraining from supplying this current does not hinder the effects of the present invention. Also, as is explained below with reference to FIG. 20, Isub corresponds to a current having an arbitrary value (current value) that is greater than or equal to a value corresponding to the difference between a light emission current IηN at an initialization time and a light emission current IηH at a transition time to a higher environmental temperature, this current value being set to a value that will not allow the amount of light in the offset light emission to reach the amount that enables writing on the photoconductor 118 even when the temperature is raised. The current Isub is referred to as "arbitrary current" hereinafter.

In FIGS. 10 and 11, a current that is close to the threshold current Ith but is less than the threshold current Ith (threshold current Ith-arbitrary current Isub) is supplied right before the modulation current is supplied. The modulation current is then supplied in addition to this current so that the semiconductor laser LD emits a predetermined amount of light. Since the threshold current Ith of the semiconductor laser LD changes depending on the environmental temperature, APC (auto power control) is performed to obtain the current (threshold current Ith-arbitrary current Isub) as a control current. APC corresponds to an operation of maintaining the amount of light being emitted at a fixed value during light emission by controlling the current being supplied to the semiconductor laser LD during the light emission period so that an output current of a photodiode PD implemented in the semiconductor laser LD is maintained at a fixed value. As is known to persons skilled in the art, APC may be performed, for example, in between writing lines for image writing, in between changing sheets of paper, or in some cases, during a light-on period in which an image is being written.

In FIG. 11, an example is shown in which a current obtained by subtracting the arbitrary current Isub from the threshold current value Ith (Ith-Isub) is supplied 1~10 ns before the modulation current is supplied. With this control current, turn on delay and overshoot of the optical waveform of the semiconductor laser LD may be prevented, thereby improving the optical waveform. As is described above, the differential quantum efficiency (slope) tends to decrease with the increase in environmental temperature. Thus, in the prior art, when a modulation current detected at a low temperature is used as a fixed modulation current, at high temperature, the bias current may exceed the actual threshold current thereby increasing the offset light emission. By subtracting the arbitrary current Isub from the threshold current Ith as in the present embodiment, the above described problem can be solved. The IL curve of FIG. 10 illustrates how this is realized. In this example, the modulation current is arranged to correspond to a current obtained by adding the arbitrary current Isub to the difference between the threshold current Ith detected at 25° C. and the operation current Iop for obtaining a predetermined amount of light P0 at 25° C. (light emission current Iη). According to the present example, even when the temperature of the semiconductor laser LD is raised to 60° C. so that the light emission current In is slightly increased, the current being supplied to the semiconductor laser LD during light-off time will not exceed the corresponding threshold current Ith for 60° C. since the arbitrary current Isub is used as a margin. In this way, the offset light emission can be reduced.

As is described above, the arbitrary current may have an arbitrary value that is greater than or equal to the difference between the light emission current IηN at the time of initialization and the light emission current IηH when the temperature is raised. When the arbitrary current Isub is set to have a large value, a wide margin can be provided for the offset light emission, but this in turn degrades the effects of reducing influences from turn on delay and overshoot of the optical waveform. Thus, the optimal current value for the arbitrary current Isub may be within a range of 1 mA to several mA. It is noted that since the optimal current value for the arbitrary current Isub varies depending on the semiconductor laser and the optical write apparatus, the value of the arbitrary current Isub may be set at an external circuit of an IC. The setting of the arbitrary current is performed by an Isub setting terminal shown in FIG. 13, and the details of this operation are described below.

In considering a practical case of using the control current (threshold current Ith-arbitrary current Isub) in a laser printer or a digital copying machine, for example, as long as the time at which the control current starts being supplied is just a short while of about 1~10 ns before the time the modulation current is supplied, the image being formed is not likely to be influenced by the control current. That is, although offset light may be generated to a certain extent, the light emission from the control current amounts to forming no more than one dot on the photoconductor 118. Also, depending on the characteristics of the semiconductor laser LD, a bias current of a certain level may have to be supplied in order to achieve a predetermined power level. Otherwise, a significant amount of time may be required to reach the predetermined power level. Similarly, advantageous effects may be obtained from supplying a bias current of a certain level in a case where the semiconductor laser LD has poor droop characteristics. Accordingly, in the present embodiment, a supply time at which the control current (threshold current Ith-arbitrary current Isub) is supplied may be freely set.

Alternatively, instead of setting the supply time of the control current (threshold current Ith-arbitrary current Isub), an external pin may be provided for inputting a signal generated at a digital ASIC. By implementing the external pin, the control current (threshold current Ith-arbitrary current Isub) may easily be arranged to be supplied at all times, for example.

As is described above, according to the present embodiment, the modulation current has a fixed value even when APC is performed. On the other hand, the difference between the threshold current Ith and the operation current for obtaining the predetermined amount of light P0 (light emission current Iη) may vary depending on the semiconductor laser LD and the amount of light. Thus, there is a need to determine the light emission current Iη. Determining the light emission current Iη (initialization) involves lighting the semiconductor laser LD that is unrelated to a scanning position, and results in unnecessarily irradiating the laser onto the photoconductor. Therefore, this operation may be performed when the power is switched on or when a job is to be started.

Figure 14:
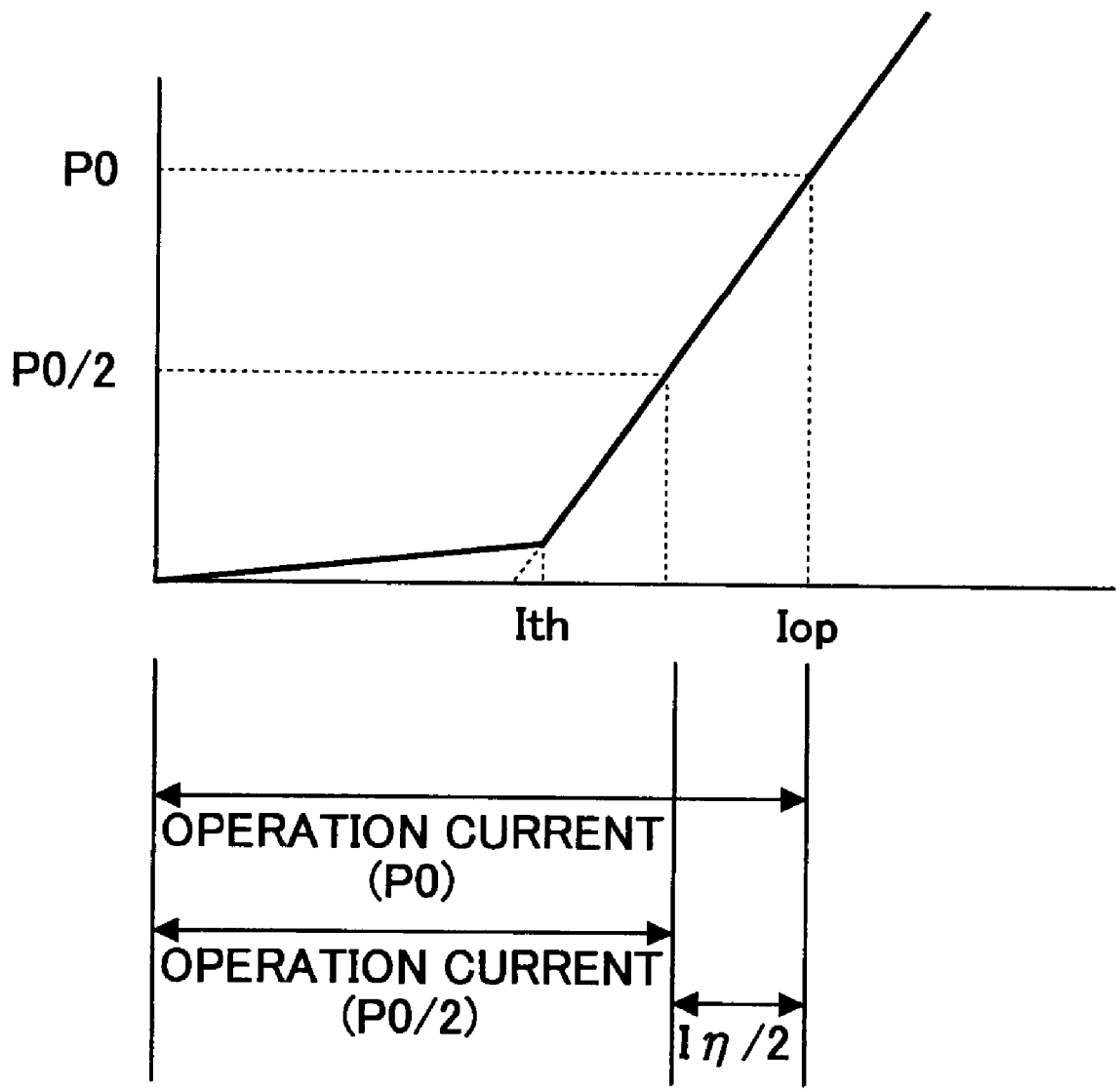
FIG. 14 is a graph illustrating a method of determining a light emission current in the circuit of FIG. 13.

In the following, the method of determining the light emission current Iη is described with reference to FIG. 14.

In this method, it is presumed that the light emission current Iη exceeding the threshold value Ith can approximately be represented by a straight line. First, the LD current is controlled so that the predetermined amount of light P0 can be obtained, and the corresponding LD current value is stored as Iop1. Then, the LD current is controlled to obtained an amount of light that is ½ of the predetermined amount of light P0 (P0/2), and the corresponding current value is stored as Iop2. Since Iop1-Iop2 corresponds to ½ of the light emission current Iη, the light emission current Iη may be obtained by multiplying the value Iop1-Iop2 by 2. It is noted that in the present example, the light emission current In is determined using ½ of the predetermined amount of light P0; however, the determination may in fact be realized using any denominator.

Figure 13:
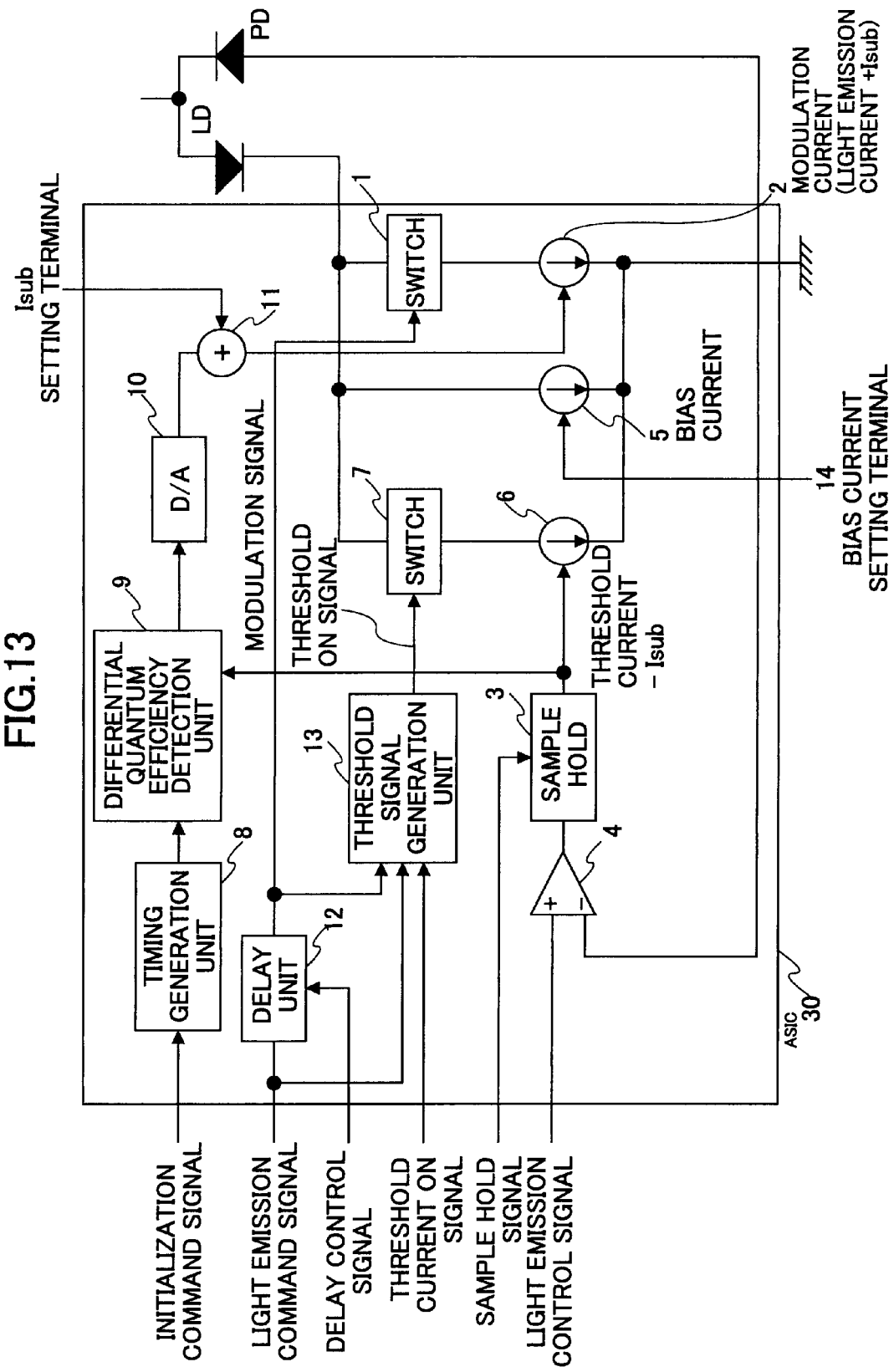
FIG. 13 is a block diagram showing a circuit configuration in a case where the semiconductor laser drive apparatus circuit of FIG. 12 is configured by a one-chip ASIC.

FIG. 13 shows a circuit configuration in a case where the semiconductor laser drive circuit shown in FIG. 12 is made up of a one-chip ASIC. It is noted that component parts identical to those shown in FIG. 12 are given the same referential notations and their descriptions are omitted.

The ASIC 30 includes a switch 1, current sources 2, 5, and 6, a sample hold circuit 3, an amplifier 4, a switch 7, a timing generation unit 8, a differential quantum efficiency detection unit 9, a digital/analog conversion unit (D/A or DAC) 10, an adder 11, a delay unit 12, and a threshold signal generation unit 13.

Figure 16:
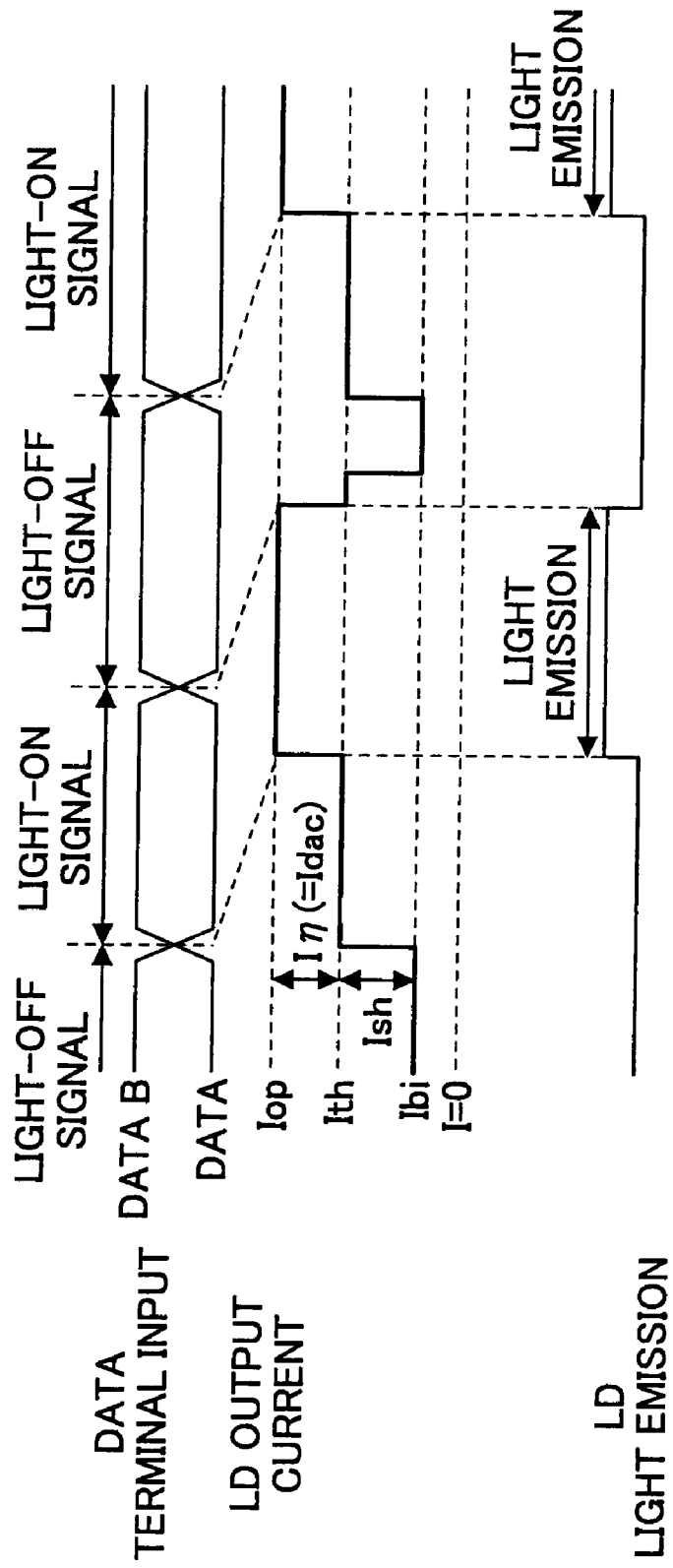
FIG. 16 is a timing chart according to an embodiment of the present invention illustrating timings of performing on/off control according to light-on and light-off signals.

A light emission command signal is input to the delay unit 12, and the light emission command signal is delayed at the delay unit 12 based on a delay control signal to be output as a modulation signal. Also, the light emission command signal and the delay control signal are logically added (OR) with a command signal from an external source (i.e., the threshold ON signal and sample hold signal in this example) to output a threshold ON signal. The modulation signal and the threshold ON signal respectively drive the modulation current switch 1 and the threshold current switch 7 so that an LD drive current as shown in FIG. 16 may be generated. Also, the threshold current Ith is sampled by a sample hold signal from an external source to perform APC. The sample hold signal may be input for every line or every few lines, or in between pages in which case the light emission command signal is turned on and the sample hold signal is input while the semiconductor laser LD emits light.

At the differential quantum efficiency detection unit 9, an operation is performed for obtaining the differential quantum efficiency n from the current for obtaining a predetermined amount of light emission and a current for obtaining a certain portion of the predetermined amount of light emission based on an initialization command signal from an external source and a signal output from the timing generation unit 8 so as to determine the emission current Iη. Then, an arbitrary current Isub that may be externally set is added to the emission current Iη to generate the modulation current for switching the semiconductor laser LD. The bias current source 5 corresponds to a circuit that constantly supplies a current to the semiconductor laser LD, and a bias current setting terminal 14 may be implemented so that the bias current value may be externally set.

Figure 15:
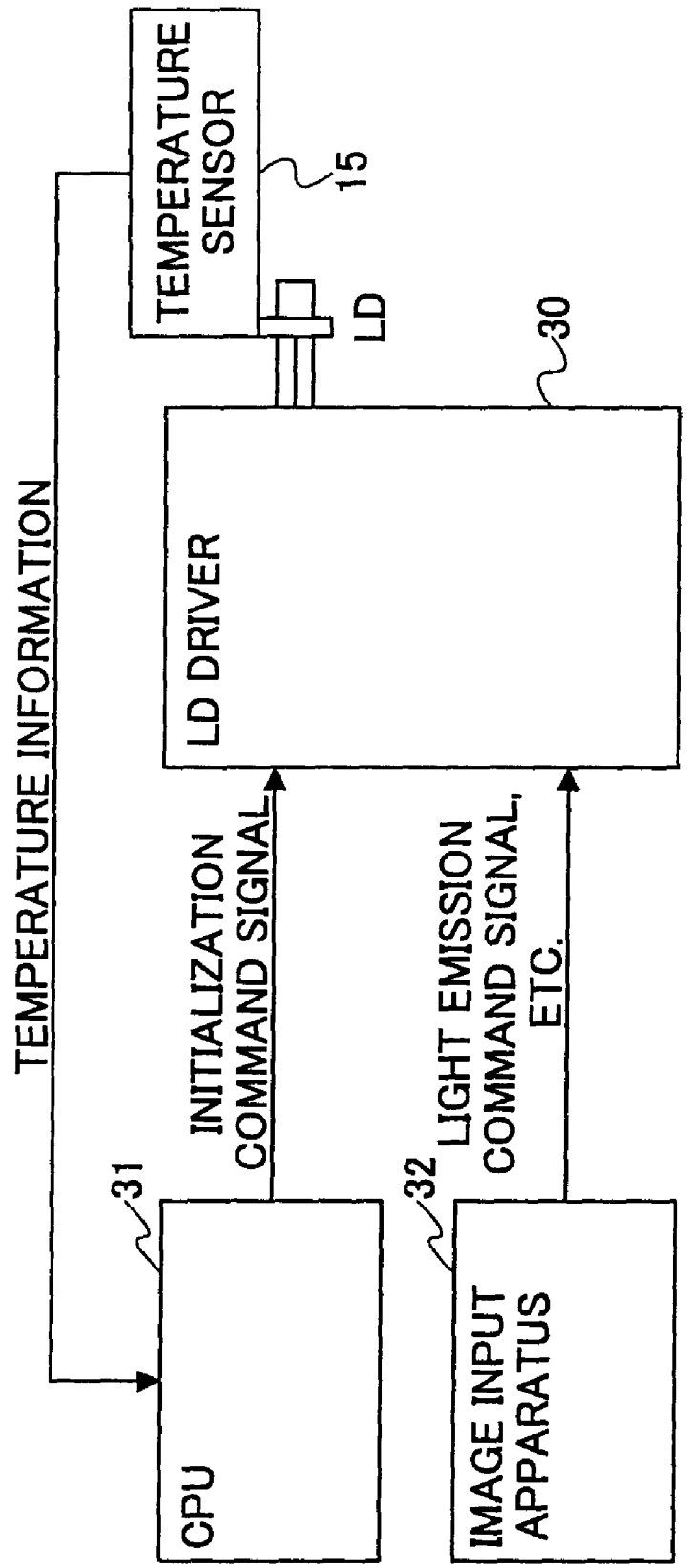
FIG. 15 is a block diagram showing a relation between the ASIC realizing the semiconductor laser drive circuit (LD driver) of the present embodiment, a CPU that administers control over the entire semiconductor laser drive apparatus, and an image input apparatus.

FIG. 15 is a block diagram illustrating a relation between the ASIC 30 realizing the semiconductor laser drive circuit (LD driver), the CPU 31 that administers overall control of the semiconductor laser drive apparatus, and the image input apparatus 32. A temperature sensor for detecting the temperature of the semiconductor laser LD is implemented, and the initialization is arranged to be preformed according to the detected temperature of the semiconductor laser LD. In other words, since the characteristics of the semiconductor laser LD change according to a change in temperature, the initialization is performed according to the temperature change so that inconveniences pertaining to offset light emission due to a change in the differential quantum efficiency η from the semiconductor temperature change can be avoided. It is noted that the environmental temperature change can be estimated to a certain extent even without implementing the temperature sensor 15, and thus, the initialization may alternatively be performed at predetermined time intervals, or after printing a predetermined number of copies or dots at which point a temperature change is expected.

The CPU 31 inputs the initialization command signal to the ASIC 30, and the image input apparatus 32 inputs the light emission command signal, the delay control signal, the threshold current ON signal, the sample hold signal, the light emission control signal, the bias current setting signal and the Isub setting signal.

In the following, the initialization process and the functions of the ASIC according to the present embodiment are described in greater detail.

(1) After the power is turned on, and before the first semiconductor power control (APC) operation, a threshold current Ith and a light emission current Iη for a LD unit that is connected to the ASIC 30 are detected. In the following descriptions, this detection process is referred to as initialization.

(2) The threshold current Ith is set at the sample hold circuit 3, and after initialization this current is continually corrected by APC. The light emission current In is set to the code of the D/A unit 10, and the current value of this current is fixed until the next initialization.

(3) After initialization, a bias current of approximately 1 mA is constantly supplied regardless of light on/off status.

(4) The threshold current Ith is generated by adding a set current Ish and a bias current Ibi at the sample hold circuit 3.

i.e., $Ith = Ibi + Ish$

The light emission current Iη is generated by a DAC current Idac that is output from the D/A unit (DAC) 10.

i.e., $I\eta = Idac$

Also, the LD drive current Iop can be obtained as follows.

$$Iop = Ith + I\eta$$
$$= Ibi + Ish + Idac$$

Figure 17:
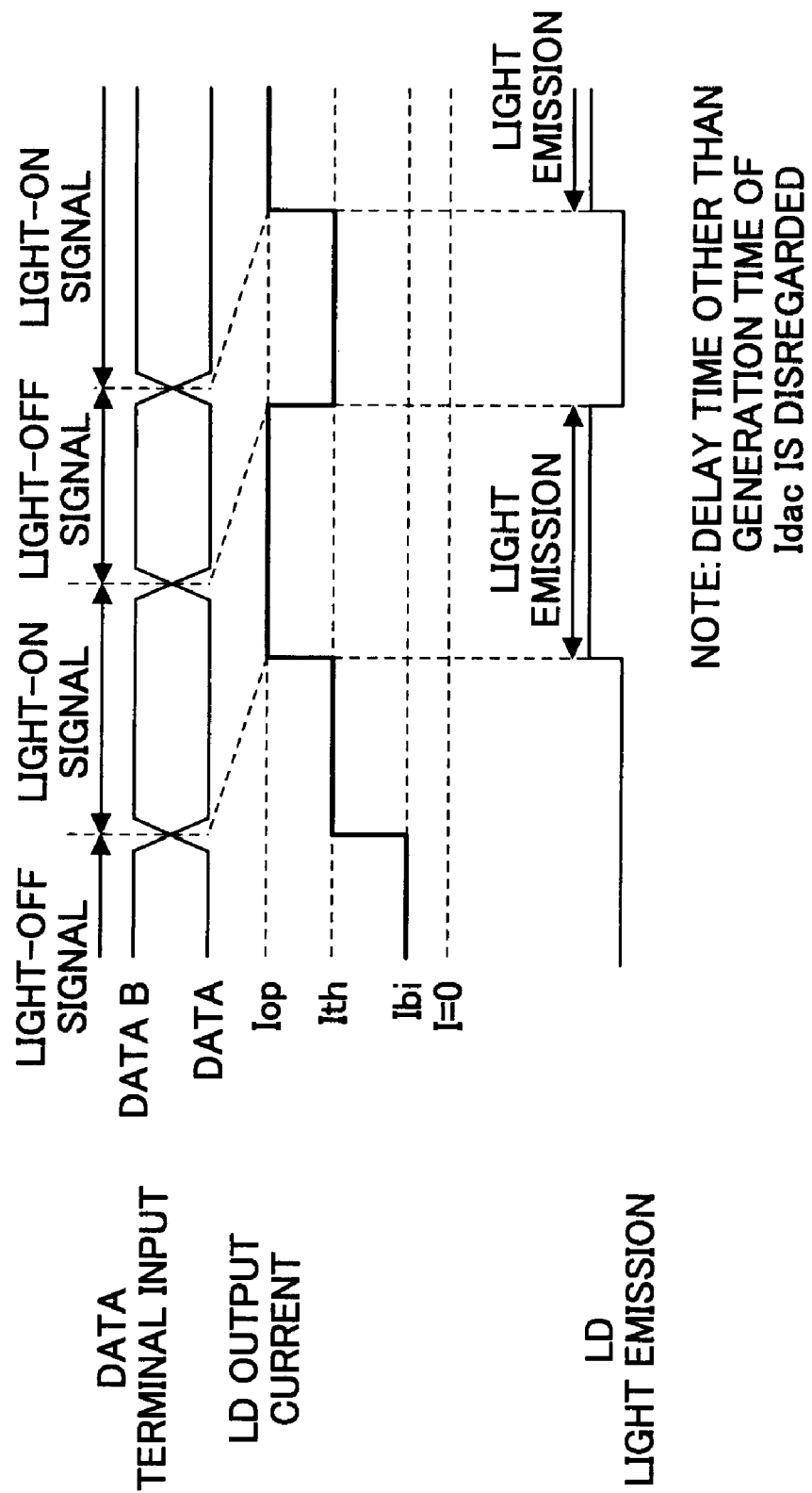
FIG. 17 is another timing chart according to an embodiment of the present invention illustrating timings of performing on/off control according to light-on and light-off signals.

(5) The modulation signal realizes on/off control. The modulation signal corresponds to LVDS (low voltage differential signal) format data, namely, DATA and DATA B signals in FIGS. 16 and 17. Thus, the on/off control is realized by the DATA and DATA B signals.

(6) The threshold current Ith is generated approximately 8 ns before the semiconductor laser LD is switched on, and during the Ith generation time period, the semiconductor laser LD is activated so that a light emission pulse width that is equal to the DATA pulse width can be obtained. Then, during the semiconductor laser LD ON period, the light emission current Iη is added so that an appropriate amount of light may be obtained.

(7) After a light-off signal is received and a halt in the supply of the light emission signal Iη is detected, the supplying of the set current Ish may be stopped (see timing chart of FIG. 16). Alternatively, in a case where the light-off period is short and the next set current Ish has to be supplied before the set current Ish can be stopped, the set current Ish may be continually supplied (see timing chart of FIG. 17).

Figure 18:
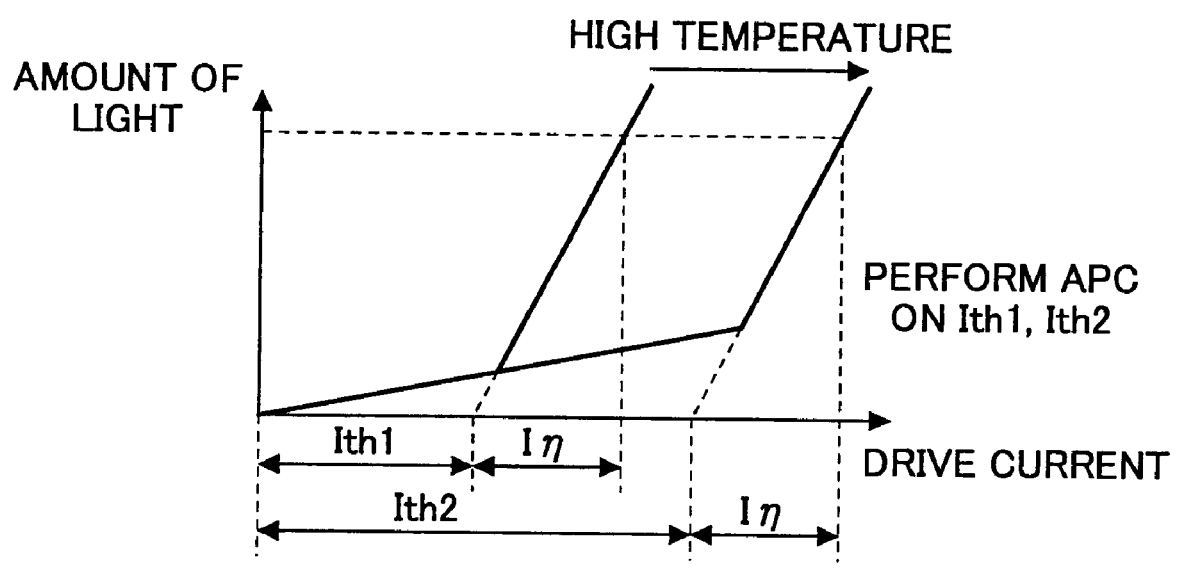
FIG. 18 is a graph showing a characteristic in a case of correcting the threshold current Ith when temperature change occurs upon completion of an initialization process according to an embodiment of the present invention.

(8) When temperature change occurs upon completion of the initialization process, and in a case where the threshold current Ith changes accordingly but the light emission current Iη is maintained at a fixed value, the threshold current Ith is compensated for as is shown in FIG. 18 (Ith1 and Ith2).

Figure 19:
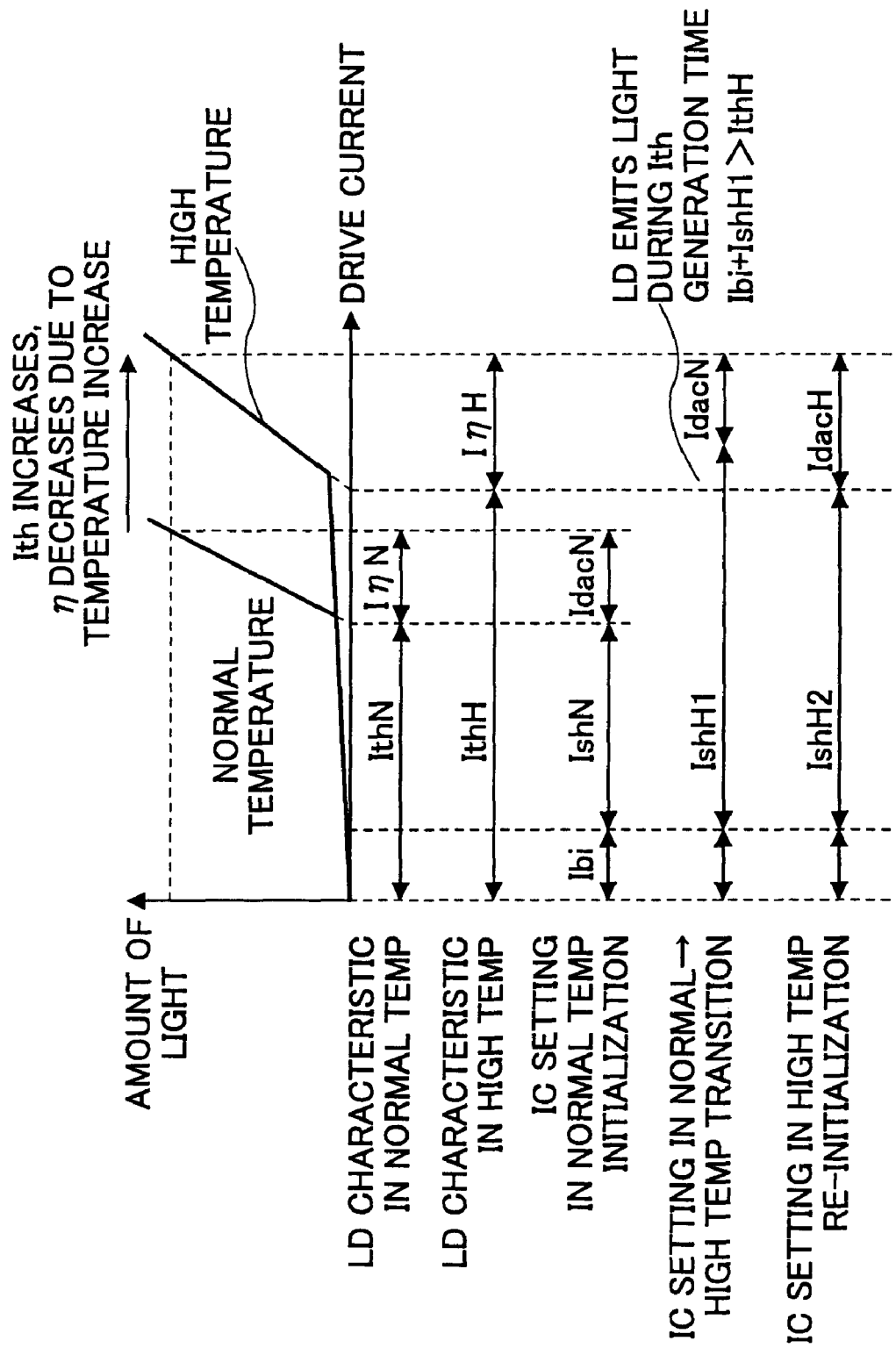
FIG. 19 is a graph showing a characteristic in a case where the temperature of the semiconductor laser increases after initialization, and the differential quantum efficiency of the semiconductor laser decreases with the increase in temperature, so that a current supplied during an Ith generation period exceeds the actual threshold current Ith, resulting in the semiconductor laser emitting light, according to an embodiment of the present invention.

(9) In a case where the differential efficiency η of the semiconductor laser LD decreases with an increase in the temperature, when the temperature of the semiconductor laser LD shifts to a higher temperature after the initialization, the light emission current Iη for obtaining the same amount of light increases. Since the LD drive current Iop is set to an appropriate value (increased value) by APC whereas the light emission current Iη has a fixed value set by the D/A unit 10 at initialization, the difference (deficit) is compensated for by changing (increasing) the set current Ish. As a result, the current supplied during the Ith generation period may be greater than the actual threshold current Ith so that the semiconductor laser LD may emit light (see FIG. 19).

i.e., $Ibi+Ish>Ith$

This condition is maintained until a re-initialization process is performed.

(10) As a countermeasure for the above problem of the semiconductor laser LD emitting light during the Ith generation period when the temperature increases after initialization, an arbitrary current Isub is added to the detected light emission current Iη to set a DAC current Idac.

i.e., $Idac=I\eta+Isub$

The arbitrary current Isub is arranged to have a value that is greater than the difference between the light emission current IηN at the time of initialization, and the light emission current IηH when the temperature is raised.

i.e., $Isub>I\eta H-I\eta N$

Herein, the drive current Iop of the semiconductor laser LD may be represented as follows.

$$Iop = Ith + I\eta$$
$$= (Ith - Isub) + (I\eta + Isub)$$
$$= Ibi + Ish + Idac$$

The characteristics described above are illustrated in FIGS. 20 and 21.

(11) The Ith generation timing may be arbitrarily controlled from an external terminal as is shown in the timing chart of FIG. 22. That is, the threshold current Ith may start being generated 8 ns or more before the semiconductor laser LD is switched on so that fluctuations in the amount of light due to thermal characteristics of the semiconductor laser LD may be reduced. When the Ith generation period is lengthened, and the influence of the offset light emission of the semiconductor laser LD on the image being formed becomes apparent, the arbitrary current Isub may be increased so that the current value of the current being supplied during the Ith generation period may be decreased. In this way, influences from offset light emission can be avoided.

As can be appreciated from the above descriptions, according to the present embodiment, the following and other advantages may be realized.

① During non-emission time, no current is supplied, or otherwise, a fixed bias current is supplied, and right before the light emission time, a current that is close to but less than the light emission threshold current is supplied. Thus, an optimal laser emission pulse that can prevent inherent light emission when light emission is unnecessary, and prevent turn on delay at the light emission time, can be obtained.

② Since an operation for determining the light emission threshold current is arranged to be performed at the time the power is turned on or when a job is to be started, unnecessary or undesired light emission for determining a differential quantum efficiency can be minimized, and unnecessary or undesired forming of toner image on the photoconductor and degradation of the photoconductor may be prevented.

③ Since an operation for obtaining the differential quantum efficiency is arranged to be performed based on a current for obtaining a predetermined amount of light, and a current for obtaining a portion of the predetermined amount of light, the light emission threshold value may be obtained in a practical manner.

④ Since the difference between the light emission threshold current and the current that is close to but less than the light emission threshold current may be arbitrarily set, the amount of inherent light emission from supplying the current that is close to but less than the light emission threshold current right before the light emission time can be controlled.

⑤ Since the difference between the light emission threshold current and the current that is close to but less than the light emission threshold current may be arbitrarily set, the amount of inherent light emission can be prevented from becoming unnecessarily large even when the difference between the threshold current and the operation current changes due to a change in the differential quantum efficiency in response to a change in environmental temperature.

⑥ Since the difference between the light emission threshold current and the current that is close to but less than the light emission threshold current is arranged to be no more than several mA, and furthermore, since the supply time of the current that is close to but less than the light emission threshold current may be arbitrarily set, and this current may be freely supplied at any time, the light emission delay (turn on delay) with respect to a light emission time can be controlled, and the amount of inherent light emission from the current that is close to but less than the light emission threshold current may also be controlled.

⑦ Since an operation of controlling the current that is close to but less than the light emission threshold current is performed by monitoring the temperature of the semiconductor laser and determining the differential quantum efficiency according to an increase in the temperature, the amount of inherent light emission can be prevented from becoming unnecessarily large even when the environmental temperature within the apparatus is changed.

⑧ Since an operation of controlling the current not reaching the light emission threshold current is performed by determining the differential quantum efficiency at predetermined time intervals, the amount of inherent light emission can be prevented from becoming unnecessarily large even when means for monitoring environmental temperature change is not provided.

⑨ The above described advantages may be realized in a write apparatus implementing a polygon mirror and an imaging apparatus implementing such a write apparatus.

The present application is based on and claims the benefit of the earlier filing date of Japanese Patent No. 2003-010205 filed on Jan. 17, 2003, the entire contents of which are hereby incorporated by reference.

What is claimed is:

1. An optical write apparatus comprising:
a semiconductor laser drive apparatus that modulates a semiconductor laser according to a modulation signal and induces the semiconductor laser to emit light, the drive apparatus including a control unit that is configured to supply a fixed bias current during a light emission off time, and configured to start supplying a predetermined current that is less than a light emission threshold current before a light emission time;

said control unit having, a bias current source and a threshold current source supplying said predetermined current that is less than the light emission threshold current, a threshold-current-source switch, said threshold current source and said threshold-current-source switch together connected in parallel with the bias current source;

a write unit that is configured to realize optical writing on an image sustaining element by scanning a laser beam that is emitted from the semiconductor laser driven by the semiconductor laser drive apparatus using a polygon mirror;

a temperature detection unit that is configured to detect a temperature of at least one of the semiconductor laser and a location in the vicinity of the semiconductor laser; and an initialization unit that is configured to perform initialization of the semiconductor laser drive apparatus based on the temperature detected by the temperature detection unit, after power to the semiconductor laser is turned on and before a first semiconductor power control operation of the semiconductor laser drive apparatus, by detecting a threshold current and a light emission current of the semiconductor laser, where the light emission current is fixed until a next initialization.

2. The optical write apparatus as claimed in claim 1, wherein the control unit comprises a modulation current source that supplies an operational current for obtaining a predetermined amount of light from the semiconductor laser, and the modulation source is connected in parallel with the bias current source and the threshold current source.

3. The optical write apparatus as claimed in claim 1, wherein the control unit comprises a threshold signal generation unit that controls said threshold switch serially connected to the threshold current source.

4. The optical write apparatus as claimed in claim 3, wherein the threshold signal generation unit has inputs of a delay signal, a light emission command signal, and a threshold ON signal, the threshold signal generation unit logically adds the delay signal, the light emission command signal, and the threshold ON signal, and the threshold signal generation unit has an output to said threshold switch for operation of said threshold switch.

5. The optical write apparatus as claimed in claim 1, further comprising:

a photodiode monitoring said light from the semiconductor laser;

an operational amplifier comparing an output from the photodiode to a light emission control signal; and a sample hold circuit that receives an output from the operational amplifier and sets the threshold current source to said predetermined current that is less than the light emission threshold current.

6. The optical write apparatus as claimed in claim 5, wherein the sample hold circuit is configured to compare the output from the photodiode at initial semiconductor laser operation to the output from the photodiode after said initial semiconductor laser operation, and the sample hold circuit adjusts a value of the predetermined current after said initial semiconductor laser operation to maintain said predetermined current less than the light emission threshold current.

7. The optical write apparatus as claimed in claim 1, wherein the drive apparatus and the control circuit comprise a one-chip ASIC circuit.

8. The optical write apparatus as claimed in claim 1, wherein the control unit comprises means for supplying an operational current to obtain a predetermined amount of light from the semiconductor laser.

9. The optical write apparatus as claimed in claim 1, wherein the control unit comprises means for controlling said threshold switch.

10. The optical write apparatus as claimed in claim 9, wherein the means for controlling said threshold switch logically adds a delay signal, a light emission command signal, and a threshold ON signal to provide an output to said threshold switch for operation of said threshold switch.

11. The optical write apparatus as claimed in claim 1, further comprising:

means for monitoring said light from the semiconductor laser;

means for comparing an output from the means for monitoring; and means for setting the threshold current source to be said predetermined current that is less than the light emission threshold current.

12. The optical write apparatus as claimed in claim 11, wherein the means for setting comprises means for comparing an output of the means for monitoring at initial semiconductor laser operation to an output of the means for comparing after said initial semiconductor laser operation, and means for adjusting a value of the predetermined current after said initial semiconductor laser operation to maintain said predetermined current less than the light emission threshold current.

13. The optical write apparatus according to claim 1, wherein the initialization unit is configured to continually correct the threshold current after the initialization.

14. An optical write apparatus comprising:

a semiconductor laser drive apparatus that modulates a semiconductor laser according to a modulation signal and induces the semiconductor laser to emit light, the drive apparatus including, means for supplying a fixed bias current during a light emission off time, and means for supplying a predetermined current that is less than a light emission threshold current before a light emission time, said means for supplying a predetermined current having, a first current source and a second current source supplying the predetermined current;

means for cutting off the second current source, and said second current source and said means for cutting off the second current source together connected in parallel with the first current source;

a write unit that realizes optical writing on an image sustaining element by scanning a laser beam that is emitted from the semiconductor laser driven by the semiconductor laser drive apparatus using a polygon mirror;

means for detecting a temperature of at least one of the semiconductor laser and a location in the vicinity of the semiconductor laser; and means for initializing the semiconductor laser drive apparatus based on the temperature detected, after power to the semiconductor laser is turned on and before a first semiconductor power control operation of the semiconductor laser drive apparatus, by detecting a threshold current and a light emission current of the semiconductor laser, where the light emission current is fixed until a next initialization.

15. The optical write apparatus according to claim 14, wherein the means for initializing continually corrects the threshold current after the initializing.

* * * * *